United States Patent
Yim

(10) Patent No.: US 10,861,540 B2
(45) Date of Patent: *Dec. 8, 2020

(54) ELECTRONIC DEVICE WITH SEMICONDUCTOR MEMORY HAVING INCREASED READ MARGIN

(71) Applicant: SK hynix Inc., Icheon-Si (KR)

(72) Inventor: Hyuck-Sang Yim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/898,654

(22) Filed: Feb. 18, 2018

(65) Prior Publication Data
US 2018/0174651 A1    Jun. 21, 2018

Related U.S. Application Data

(63) Continuation of application No. 15/333,065, filed on Oct. 24, 2016, now Pat. No. 9,899,080.

(30) Foreign Application Priority Data

Apr. 8, 2016 (KR) ........................ 10-2016-0043276

(51) Int. Cl.
*G11C 13/00* (2006.01)
*G11C 29/02* (2006.01)
(Continued)

(52) U.S. Cl.
CPC .............. *G11C 13/004* (2013.01); *G11C 7/08* (2013.01); *G11C 29/021* (2013.01);
(Continued)

(58) Field of Classification Search
CPC ...... G06F 3/061; G06F 3/0656; G06F 3/0679; G06F 12/0802; G06F 2212/60;
(Continued)

(56) References Cited

U.S. PATENT DOCUMENTS 5,724,297 A    3/1998  Noda et al.
6,791,873 B1   9/2004  Perner
(Continued)

FOREIGN PATENT DOCUMENTS

CN    1395253 A      2/2003
CN  103366807 A     10/2013
(Continued)

OTHER PUBLICATIONS

Harris, D. et al., Digital design and computer architecture, 2013, pp. 382-385, 2nd ed., Elsevier/Morgan Kaufmann.
(Continued)

*Primary Examiner* — Vanthu T Nguyen
(74) *Attorney, Agent, or Firm* — Perkins Coie LLP

(57) ABSTRACT

An electronic device including a semiconductor memory. The semiconductor memory may include a cell array including a plurality of resistive storage cells; a current code generation block suitable for generating a current code which has a value corresponding to an average value of current amounts of test currents respectively flowing through at least two first resistive storage cells among the plurality of resistive storage cells, in a test operation; and a sensing block suitable for comparing a read current flowing through a second resistive storage cell selected among the plurality of resistive storage cells with a reference current, and thereby sensing data of the second resistive storage cell, wherein the semiconductor memory is operable to adjust a current amount of at least one current flowing through the sensing block based on the value of the current code.

19 Claims, 24 Drawing Sheets

(51) Int. Cl.
*G11C 29/50* (2006.01)
*G11C 29/12* (2006.01)
*G11C 7/08* (2006.01)
*G11C 11/16* (2006.01)

(52) U.S. Cl.
CPC ............ *G11C 29/028* (2013.01); *G11C 29/12* (2013.01); *G11C 29/12005* (2013.01); *G11C 29/50008* (2013.01); *G11C 11/1673* (2013.01); *G11C 2013/0045* (2013.01); *G11C 2013/0054* (2013.01); *G11C 2029/5006* (2013.01)

(58) Field of Classification Search
CPC ............ G11C 13/0007; G11C 13/004; G11C 13/0069; G11C 29/12; G11C 2013/0054
See application file for complete search history.

(56) References Cited

U.S. PATENT DOCUMENTS

| | | | |
|---|---|---|---|
| 7,319,625 B2 | 1/2008 | Chang et al. | |
| 7,668,031 B2 * | 2/2010 | Kang | G11C 7/14 365/145 |
| 7,944,282 B2 | 5/2011 | Maejima | |
| 8,654,595 B2 | 2/2014 | Kim et al. | |
| 8,659,966 B2 | 2/2014 | Choi et al. | |
| 8,917,536 B2 | 12/2014 | Jan et al. | |
| 9,036,418 B2 | 5/2015 | Oh | |
| 9,183,910 B2 | 11/2015 | Lee et al. | |
| 9,405,615 B2 | 8/2016 | Sunwoo et al. | |
| 2013/0258778 A1 | 10/2013 | Oh | |
| 2014/0063904 A1 | 3/2014 | Yon | |
| 2014/0192588 A1 | 7/2014 | Lee et al. | |

FOREIGN PATENT DOCUMENTS

| | | |
|---|---|---|
| CN | 103456356 A | 12/2013 |
| CN | 103680616 A | 3/2014 |
| CN | 104916311 A | 9/2015 |
| KR | 10-2012-0136662 A | 12/2012 |
| KR | 10-2014-0061849 A | 5/2014 |
| TW | 201611010 | 3/2016 |

OTHER PUBLICATIONS

Office Action for Taiwan Patent Application No. 10820437980, dated May 9, 2019 (21 pages).

* cited by examiner

ELECTRONIC DEVICE WITH SEMICONDUCTOR MEMORY HAVING INCREASED READ MARGIN

CROSS-REFERENCE TO RELATED APPLICATION

Under 35 U.S.C. § 119, this patent document is a continuation of, and claims priority and benefits of, U.S. patent application Ser. No. 15/333,065, published as US 2017/0294226 A1, entitled "ELECTRONIC DEVICE," and filed on Oct. 24, 2016, which further claims the priority and benefits of Korean Patent Application No. 10-2016-0043276, entitled "ELECTRONIC DEVICE" and filed on Apr. 8, 2016, The contents of the before-mentioned patent applications (including US 2017/0294226 A1) are incorporated herein by reference in their entirety as part of the disclosure of this document.

TECHNICAL FIELD

This patent document relates to memory circuits or devices and their applications in electronic devices or systems.

DISCUSSION OF THE RELATED ART

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistance states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The technology for electronic devices with semiconductor memory is described below in various embodiments in which a read margin is increased by reflecting the characteristic of each cell array on a read current or a reference current.

In one embodiment, an electronic device including a semiconductor memory is provided. The semiconductor memory may include a cell array including a plurality of resistive storage cells; a current code generation block suitable for generating a current code which has a value corresponding to an average value of current amounts of test currents respectively flowing through at least two first resistive storage cells among the plurality of resistive storage cells, in a test operation; and a sensing block suitable for comparing a read current flowing through a second resistive storage cell selected among the plurality of resistive storage cells with a reference current, and thereby sensing data of the second resistive storage cell, wherein the semiconductor memory is operable to adjust a current amount of at least one current flowing through the sensing block based on the value of the current code.

In another aspect, an electronic device including a semiconductor memory is provided to comprise: cell arrays for storing data, each cell array including a plurality of resistive storage cells for storing data; current code generation blocks suitable for generating corresponding current codes respectively corresponding to the cell arrays, in a test operation, each current code having a value corresponding to an average value of current amounts of test currents respectively flowing through at least two first resistive storage cells in a corresponding cell array; and sensing blocks each suitable for comparing a read current flowing through a second resistive storage cell selected among the plurality of resistive storage cells of a corresponding cell array among the cell arrays, with a reference current, and thereby sensing data of the second resistive storage cell, wherein the semiconductor memory is operable to adjust current amounts of one or more currents flowing through the sensing blocks based on values of the current codes.

In some implementations, the semiconductor memory may further include a nonvolatile storage block for storing the current code and coupled to the current code generation block. In some implementations, the current code generation block may include an average current generation unit that generates an average current which has a current amount corresponding to the average value of the current amounts of the test currents, in the test operation; and a code generation unit that generates the current code based on the average current. In some implementations, the average current generation unit may include at least two current copy sections that generate copy currents by copying the test current flowing through a first resistive storage cell selected among a group of first resistive storage cells, and generates the average current by summing the copy currents copied by the at least two current copy sections. In some implementations, the code generation unit may include an integrator that integrates the average current according to a time and generating an output voltage; and a plurality of comparing sections that compare the output voltage with a plurality of comparison voltages which have different levels, after a predetermined time passes from a time at which integration of the integrator is started, and generate corresponding bits among a plurality of bits included in the current code. In some implementations, the semiconductor memory may be structured such that, in the test operation, the plurality of resistive storage cells or all of the cell arrays are written with the same data. In some implementations, the semiconductor memory may be operable to adjust current amounts of the reference currents of the sensing block(s) based on the values of the current code, and be operable to increase each of the current amounts of the reference currents of the sensing block(s) when the average value of the current amounts of the test currents is increased, and to decrease each of the current amounts of the reference currents of the sensing block(s) when the average value of the current amounts of the test currents is decreased.

In some implementations, the semiconductor memory may be operable to adjust current amounts of the read currents of the sensing blocks(s) based on the values of the current codes, and wherein the semiconductor memory is operable to decrease each of the current amounts of the read currents of the sensing block(s) when the average value of the current amounts of the test currents is increased, and to increase each of the current amounts of the read currents of the sensing block(s) when the average value of the current amounts of the test currents is decreased.

In some implementations, each of the resistive storage cells may include: a variable resistance element structured to exhibit variable resistance values and being set at a particular resistance value representing data stored in the resistive storage cell; and a selection element coupled to the variable resistance element to turn on or off a conductive path to the variable resistance element.

In some implementations, the variable resistance element may include a metal oxide or a structure in which a tunneling barrier layer is interposed between two ferromagnetic layers. In some implementations, the electronic device may further include a microprocessor including a control unit for receiving a signal having a command from an outside of the microprocessor, extracting or decoding the command, or performing input/output control of the signal of the microprocessor; an operation unit for performing an operation according to a decoding result of the command in the control unit; and a storage unit for storing data to be operated, data corresponding to an operation result, or an address of the data to be operated. The semiconductor memory may be a part of the storage unit within the microprocessor.

In some implementations, the electronic device may further include a processor including a core unit for performing an operation corresponding to a command using data according to the command input from an outside of the processor; a cache memory unit for storing data to be operated, data corresponding to an operation result, or an address of the data to be operated; and a bus interface which is coupled between the core unit and the cache memory unit, and transfers data between the core unit and the cache memory unit. The semiconductor memory may be a part of the cache memory unit within the processor.

In some implementations, the electronic device may further include a processing system including a processor for interpreting a received command, and controlling an operation of information according to an interpreting result of the command; an auxiliary memory device for storing a program for interpreting the command and the information; a main memory device for importing and storing the program and the information from the auxiliary memory device such that the processor may perform the operation using the program and the information when the program is executed; and an interface device for performing communication between one or more of the processor, the auxiliary memory device and the main memory device and an outside. The semiconductor memory may be a part of the auxiliary memory device or the main memory device within the processing system.

In some implementations, the electronic device may further include a data storage system including a storage device for storing data and retaining the stored data regardless of a power supply; a controller for controlling data input/output of the storage device according to a command input from an outside; a temporary storage device for temporarily storing the data which is exchanged between the storage device and the outside; and an interface for performing communication between one or more of the storage device, the controller and the temporary storage device and the outside. The semiconductor memory may be a part of the storage device or the temporary storage device within the data storage system.

In some implementations, the electronic device may further include a memory system including a memory for storing data and retaining the stored data regardless of a power supply; a memory controller for controlling data input/output of the memory according to a command input from an outside; a buffer memory for buffering the data which is exchanged between the memory and the outside; and an interface for performing communication between one or more of the memory, the memory controller and the buffer memory and the outside. The semiconductor memory may be a part of the memory or the buffer memory within the memory system.

In another aspect, an electronic device may include a semiconductor memory. The semiconductor memory may include cell arrays for storing data, each cell array including a plurality of resistive storage cells; a current code generation block that generates current codes among current codes respectively corresponding to the cell arrays, in a test operation, each of the current codes having a value corresponding to an average value of current amounts of test currents respectively flowing through at least two first resistive storage cells in a corresponding cell array; and sensing blocks coupled to the cell arrays, each sensing block operable to compare a read current flowing through a second resistive storage cell selected among the plurality of resistive storage cells of a corresponding cell array, with a reference current, and thereby sensing data of the second resistive storage cell.

In some implementations, the semiconductor memory may be operable to adjust current amounts of one or more currents flowing through the sensing blocks based on values of the current codes. In some implementations, the semiconductor memory may further include: a nonvolatile storage block that stores the current codes and is coupled to the current code generation block. In some implementations, the current code generation block may generate a current code corresponding to a cell array selected among the cell arrays, in the test operation. In some implementations, the semiconductor memory may be operable to adjust current amounts of reference currents of the sensing blocks based on the values of the current codes, and be operable to increase each of the current amounts of the reference currents of the sensing blocks when the average value of the current amounts of the test currents is increased, and to decrease each of the current amounts of the reference currents of the sensing blocks when the average value of the current amounts of the test currents is decreased. In some implementations, the semiconductor memory may be operable to adjust current amounts of read currents of the sensing blocks based on the values of the current codes, and be operable to decrease each of the current amounts of the read currents of the sensing blocks when the average value of the current amounts of the test currents is increased, and to increase each of the current amounts of the read currents of the sensing blocks when the average value of the current amounts of the test currents is decreased.

DETAILED DESCRIPTION

Figure 1:
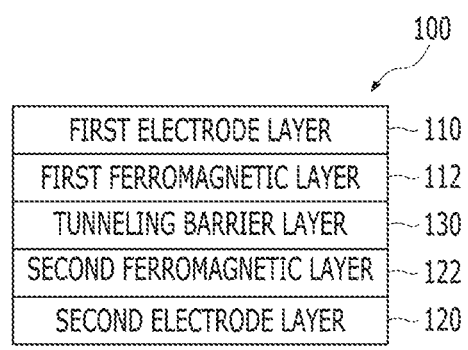
FIG. 1 is a diagram showing an example of a magnetic tunnel junction (MTJ) as one of structures in which a tunneling barrier layer is interposed between two ferromagnetic layers.

Various embodiments are described below in more detail with reference to the accompanying drawings. The disclosed technology may be embodied in different forms beyond the specific embodiments set forth herein. Throughout the disclosure, like reference numerals refer to like parts throughout the various figures and embodiments of the disclosed technology.

Each of semiconductor devices in accordance with embodiments may include variable resistance elements. In the following descriptions, a variable resistance element exhibits a variable resistance characteristic with different resistance states of different resistance values and may include a single layer or a multi-layer. For example, a variable resistance element may include a material used in a PRAM, an RRAM, an FRAM or an MRAM, for example, a chalcogenide-based compound, a transition metal compound, a ferroelectric or a ferromagnetic. However, the implementaions of the disclosed technology are not limited to these materials, and it is sufficient for a variable resistance element to have a variable resistance characteristic in that it is switched between different resistance states according to voltages or currents applied to both ends thereof.

In some implementations, a variable resistance element may include a metal oxide. For example, the metal oxide may be a transition metal oxide such as a nickel (Ni) oxide, a titanium (Ti) oxide, a hafnium (Hf) oxide, a zirconium (Zr) oxide, a tungsten (W) oxide and a cobalt (Co) oxide, or a perovskite-based material such as STO (SrTiO) or PCMO (PrCaMnO). Such a variable resistance element may exhibit a characteristic that it can be controlled to switch between different resistance states due to creation and extinction of current filaments through behavior of vacancies.

In other implementations, a variable resistance element may include a phase change material. The phase change material may include, for example, a chalcogenide-based material such as a GST (Ge—Sb—Te). Such a variable resistance element may be stabilized to any one of a crystalline state and an amorphous state and thereby exhibit a characteristic that it is switched between different resistance states.

Further, a variable resistance element may include a structure in which a tunneling barrier layer is interposed between two ferromagnetic layers. The ferromagnetic layers may be formed of a material such as NiFeCo and CoFe, and the tunneling barrier layer may be formed of a material such as $Al_2O_3$. Such a variable resistance element may exhibit a characteristic that it is switched between different resistance states according to magnetization directions of the ferromagnetic layers. For example, in the case where the magnetization directions of the two ferromagnetic layers are parallel to each other, the variable resistance element may be in a low resistance state, and, in the case where the magnetization directions of the two ferromagnetic layers are anti-parallel to each other, the variable resistance element may be in a high resistance state.

FIG. 1 is a diagram showing an example of a magnetic tunnel junction (MTJ) as one of structures in which a tunneling barrier layer is interposed between two ferromagnetic layers.

As shown in FIG. 1, an MTJ 100 includes a first electrode layer 110 as a top electrode, a second electrode layer 120 as a bottom electrode, a first ferromagnetic layer 112 and a second ferromagnetic layer 122 as a pair of ferromagnetic layers, and a tunneling barrier layer 130 which is formed between the pair of ferromagnetic layers 112 and 122.

The first ferromagnetic layer 112 may be a free ferromagnetic layer of which magnetization direction may be changed according to the direction of a current applied to the MTJ 100, and the second ferromagnetic layer 122 may be a pinned ferromagnetic layer of which magnetization direction is pinned.

Such an MTJ 100 is changed in its resistance value according to the direction of the current, and records data "0" or "1".

Figure 2A:
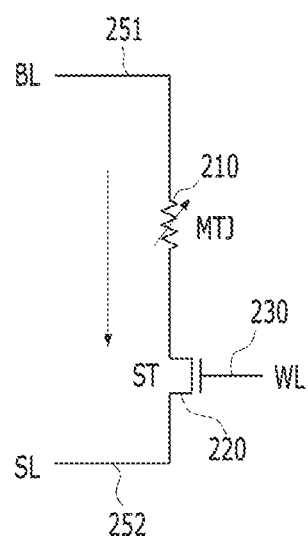
FIGS. 2A and 2B are diagrams illustrating operations for storing data in a variable resistance element.
Figure 2B:
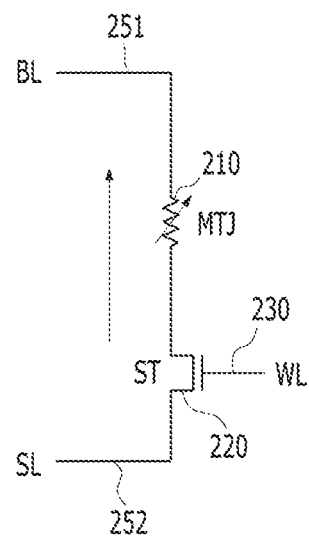

FIGS. 2A and 2B illustrate examples of operations for storing data in a variable resistance element 210. The variable resistance element 210 may be the MTJ 100 described above with reference to FIG. 1.

FIG. 2A illustrates recording data with a low logic value in the variable resistance element 210. In order to select the variable resistance element 210 to store data, a word line 230 electrically coupled to the variable resistance element 210 is activated, and a transistor 220 is turned on. As a current flows from one end 251 to the other end 252 (in the direction indicated by the arrow), that is, from the first electrode layer 110 as a top electrode to the second electrode layer 120 as a bottom electrode in the MTJ 100 shown in FIG. 1, the magnetization direction of the first ferromagnetic layer 112 as a free ferromagnetic layer and the magnetization direction of the second ferromagnetic layer 122 as a pinned ferromagnetic layer become parallel to each other, and the variable resistance element 210 is in a low resistance state. When the variable resistance element 210 is in the low resistance state, it is defined that 'low' data is stored in the variable resistance element 210.

FIG. 2B illustrates recording data with a high logic value in the variable resistance element 210. In a similar manner, the word line 230 electrically coupled to the variable resistance element 210 is activated, and the transistor 220 is turned on. As a current flows from the other end 252 to one end 251 (in the direction indicated by the arrow), that is, from the second electrode layer 120 to the first electrode layer 110 in the MTJ 100 shown in FIG. 1, the magnetization direction of the first ferromagnetic layer 112 and the magnetization direction of the second ferromagnetic layer 122 become anti-parallel to each other, and the variable resistance element 210 is in a high resistance state. When the variable resistance element 210 is in the high resistance state, it is defined that 'high' data is stored in the variable resistance element 210.

The logic value of the data stored in the variable resistance element 210 is changed depending upon the resistance value of the variable resistance element 210. In the case where the difference in the resistance values of the high resistance state and the low resistance state of the variable resistance element 210 is large, it is easy to discriminate the data stored in the variable resistance element 210. In the case where the difference in the resistance values of the high resistance state and the low resistance state of the variable resistance element 210 is small, it is difficult to discriminate the data stored in the variable resistance element 210, and thus, the probability of an error to occur in discriminating data increases. Therefore, a technology capable of precisely discriminating data stored in a variable resistance element even though the difference in the resistance values of the high resistance state and the low resistance state of the variable resistance element is small is demanded.

Figure 3:
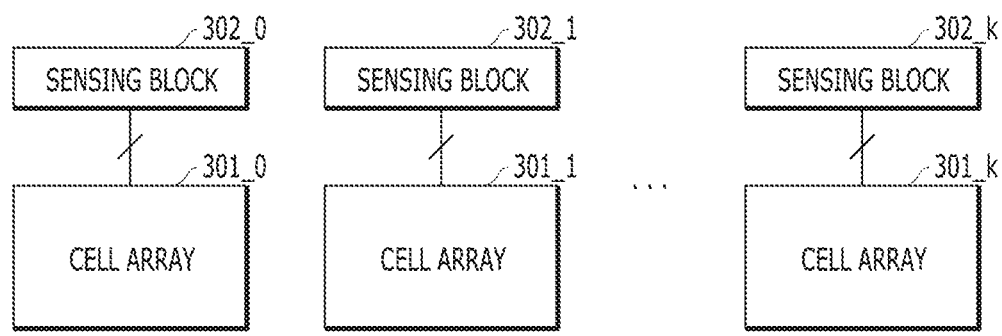
FIG. 3 is a representation of an example of a diagram to assist in the explanation of a problem that is likely to occur in a memory circuit (device) having variable resistance elements.

FIG. 3 is a representation of an example of a diagram to assist in the explanation of a problem that is likely to occur in a memory circuit (device) having variable resistance elements. Referring to FIG. 3, a memory circuit (device) may include a plurality of cell arrays 301_0 to 301_k (k is a natural number) and a plurality of sensing blocks 302_0 to 302_k.

Each of the cell arrays 301_0 to 301_k may include a plurality of resistive storage cells (not shown) each of which has a resistance value determined depending upon data stored therein. Each of the sensing blocks 302_0 to 302_k may correspond to one cell array. Each of the sensing blocks 302_0 to 302_k may sense the data of a resistive storage cell selected in a corresponding cell array, by comparing a current flowing through the selected resistive storage cell with a reference current having a predetermined current amount.

Each of the plurality of resistive storage cells includes a variable resistance element, and the variable resistance element may have a resistance value that is determined depending upon the value of the data stored in a corresponding resistive storage cell. A variable resistance element may be a low resistance state in the case where low data (e.g., 0) is stored, and be a high resistance state in the case where high data (e.g., 1) is stored. Otherwise, a variable resistance element may be a low resistance state in the case where high data is stored, and be a high resistance state in the case where low data is stored.

In the case of being manufactured ideally, respective cell arrays and respective sensing blocks should have substantially perfectly the same characteristics. However, because actual processes are not perfect, deviations may be induced in the characteristics of the respective cell arrays and the respective sensing blocks. For example, the resistance values of the low resistance states or the high resistance states of resistive storage cells may be different from one another, and the current amounts of reference currents in the sensing blocks may be different from one another. Such deviations may resultantly decrease a read margin.

FIGS. 4, 10, 12 and 14 illustrate embodiments of memory circuits (devices) which have variable resistance elements as described above.

Figure 4:
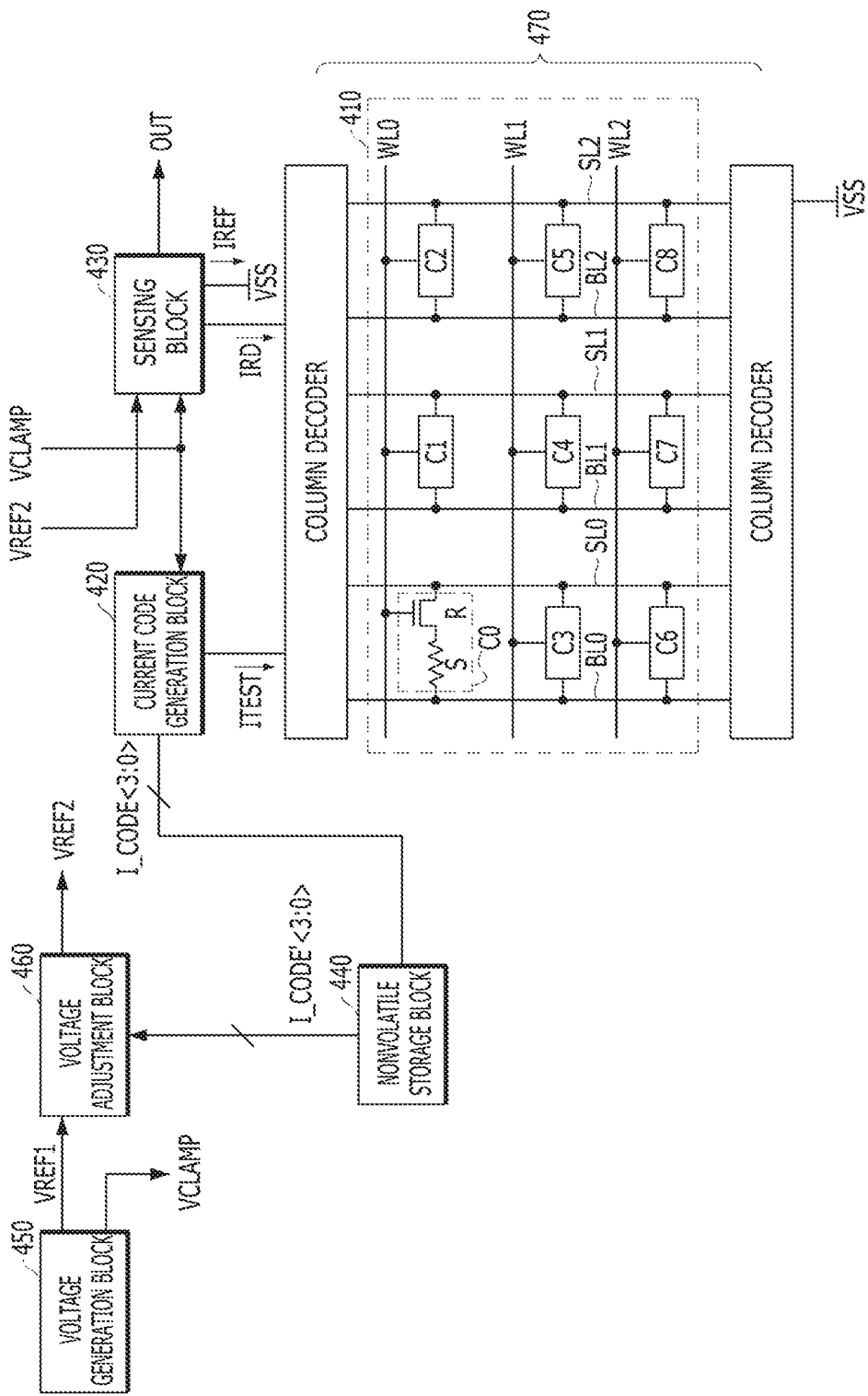
FIG. 4 is a configuration diagram illustrating a representation of an example of a memory circuit (device) including variable resistance elements.

FIG. 4 is a configuration diagram illustrating a representation of an example of a memory circuit (device) including resistive storage cells (e.g., C0 to C8) with variable resistance elements R that store data bits based on their respective variable resistance states.

Referring to FIG. 4, a memory circuit (device) may include a cell array 410 formed by the resistive storage cells (e.g., C0 to C8) and cell array circuitry that operates the cell array 410. As illustrated in the example in FIG. 4, the cell array circuitry may include, e.g., a current code generation block 420, a sensing block 430, a nonvolatile storage block 440, a voltage generation block 450, a voltage adjustment block 460, and a column decoder 470. Other implementations of the cell array circuitry are possible.

The cell array 410 may include, in connection with the plurality of resistive storage cells C0 to C8, a plurality of word lines WL0 to WL2, a plurality of bit lines BL0 to BL2, and a plurality of source lines SL0 to SL2 that are coupled to the resistive storage cells C0 to C8 to provide interconnections and signaling paths for operating the cell array 410 for reading and storing data in the resistive storage cells C0 to C8. Each of the resistive storage cells C0 to C8 may be coupled between a corresponding bit line and a corresponding source line among the plurality of bit lines BL0 to BL2 and the plurality of source lines SL0 to SL2, and be coupled with a corresponding word line among the plurality of word lines WL0 to WL2.

Each of the resistive storage cells C0 to C8 may include, in addition to a variable resistance element R for storing data, a selection element S which is coupled in series to the variable resistance element R as a controllable switch for turning on or off the conductive path to the variable resistance element R for selecting or delecting the variable resistance element R. In some implementations, the selection element S may be a transistor, a diode or another suitable switching circuit element. The variable resistance element R may be a low resistance state in the case where low data is stored, and be a high resistance state in the case where high data is stored. Otherwise, the variable resistance element R may be a low resistance state in the case where high data is stored, and be a high resistance state in the case where low data is stored. Hereinbelow, descriptions will be made on the assumption that the variable resistance element R is a low resistance state in the case where low data is stored and is a high resistance state in the case where high data is stored.

The current code generation block 420 may generate a current code I_CODE<3:0> which has a value corresponding to the average value of the current amounts of test currents ITEST respectively flowing through at least two resistive storage cells among the resistive storage cells C0 to C8, in a test operation. This test operation is used to detect the resistance states of the resistive storage cells in the cell array 410 which may be in a low data or high data state. For example, the current code generation block 420 may control the test current ITEST to flow through the four resistive storage cells C0, C2, C6 and C8 which are sequentially selected, and generate the current code I_CODE<3:0> corresponding to the average value of the current amounts of the test currents ITEST flowing through the resistive storage cells C0, C2, C6 and C8. Therefore, if the current amounts of the test currents ITEST flowing through the resistive storage cells C0, C2, C6 and C8 are ITEST1, ITEST2, ITEST3 and ITEST4, respectively, the current code generation block 420 may generate the current code I_CODE<3:0> having a value corresponding to an average value of (ITEST1+ITEST2+ITEST3+ITEST4)/4. In the test operation, the current code generation block 420 may apply the same voltages as those in a read operation, to both ends of a selected resistive storage cell, and thus may direct the test current ITEST to the selected resistive storage cell.

The sensing block 430 may compare a read current IRD flowing through a resistive storage cell selected among the resistive storage cells C0 to C8 with a reference current IREF, and thereby sense the data of the selected resistive storage cell in a read operation.

In the memory circuit (device) shown in FIG. 4, the current amount of the reference current IREF may be adjusted according to the value of a current code I_CODE'<3:0> outputted from the nonvolatile storage block 440. The sensing block 430 may output the data of the selected resistive storage cell as low data OUT if the current amount of the read current IRD is larger than the current amount of the reference current IREF, and output the data of the selected resistive storage cell as high data OUT if the current amount of the read current IRD is smaller than the current amount of the reference current IREF.

The nonvolatile storage block 440 may be one of nonvolatile memory circuits such as a fuse circuit, a ROM (read only memory), a NOR flash memory, a NAND flash memory, a PRAM (phase change random access memory), an RRAM (resistive random access memory), an STTRAM (spin transfer torque random access memory) and an MRAM (magnetic random access memory), and various circuits which perform functions similar to the nonvolatile memory circuits to store data. The nonvolatile storage block 440 may store the current code I_CODE<3:0> when the current code I_CODE<3:0> is generated by the current code generation block 420, and output the current code I_CODE'<3:0> to the voltage adjustment block 460 when the memory circuit (device) operates. For reference, the current code I_CODE<3:0> generated by the current code generation block 420 and the current code I_CODE'<3:0> outputted from the nonvolatile storage block 440 may have the same value.

The voltage generation block 450 may generate various voltages to be used in the memory circuit (device). FIG. 4 illustrates a case where the voltage generation block 450 generates a clamp voltage VCLAMP which is used to adjust the current amount of the read current IRD and a first reference voltage VREF1 which is used to adjust the current amount of the reference current IREF.

The voltage adjustment block 460 may adjust the voltage level of the first reference voltage VREF1 according to the value of the current code I_CODE'<3:0>, and generate a second reference voltage VREF2. For example, in the case where the value of the current code I_CODE'<3:0> increases as the average value of the current amounts of the test currents ITEST is large, that is, in the case where the average value of the current amounts of the test currents ITEST and the value of the current code I_CODE'<3:0> are proportional to each other, the voltage adjustment block 460 may increase or raise the voltage level of the second reference voltage VREF2 as the value of the current code I_CODE'<3:0> increases and lower the voltage level of the second reference voltage VREF2 as the value of the current code I_CODE'<3:0> decreases. The current amount of the reference current IREF may be increased as the voltage level of the second reference voltage VREF2 is increased or raised, and be decreased as the voltage level of the second reference voltage VREF2 is lowered.

The column decoder 470 may cause a bit line and a source line which are selected by a column address, to be driven by predetermined voltages. In the test operation, the column decoder 470 may cause the bit line selected by the column address, to be coupled with the current code generation block 420, and cause a ground voltage VSS to be applied to the selected source line. Also, in the read operation, the column decoder 470 may cause the bit line selected by the column address, to be coupled with the sensing block 430, and cause the ground voltage VSS to be applied to the selected source line.

Hereinbelow, the test operation of the memory circuit (device) is described.

In the test operation of the memory circuit (device) shown in FIG. 4, first, one data value of either a low data value or a high data value may be written in all the resistive storage cells C0 to C8 included in the cell array 410. Then, the test current ITEST may be flowed to some or all of the resistive storage cells C0 to C8 included in the cell array 410, and the current code I_CODE<3:0> corresponding to the average value of the current amounts of the test currents ITEST flowing through the respective resistive storage cells may be generated. The generated current code I_CODE<3:0> may be stored in the nonvolatile storage block 440. Thereafter, in the read operation of the memory circuit (device), the second reference voltage VREF2 having a voltage level on which the value of the current code I_CODE'<3:0> is reflected may be generated, and the read operation may be performed using the second reference voltage VREF2, whereby a read margin may be increased.

For reference, the average value of test current amounts that are detected through the test operation is resultantly the average value of the current amounts flowed when the tested resistive storage cells have low data or high data. Therefore, it is possible to detect, through the test operation, that the resistive storage cells included in the cell array 410 have which resistance value in average when they are written with low data or high data. In the case where the average value of the current amounts of the test currents ITEST is larger than the current value of the read current of a resistive storage cell generally known in the art, it may be meant that the resistance values of the resistive storage cells included in the cell array 410 tend to be smaller than a general case. In the opposite case, it may be meant that the resistance values of the resistive storage cells included in the cell array 410 tend to be larger than the general case.

While it is illustrated in FIG. 4, for the sake of convenience in explanation, that the cell array 410 includes nine resistive storage cells which are arranged in the form of a 3×3 matrix, it is to be noted that the cell array 410 may include, in various applications, a large number of resistive storage cells, e.g., at least several tens to several hundreds of rows and at least several tens to several hundreds of columns, in some memory circuits based on the disclosed technology.

Figure 5:
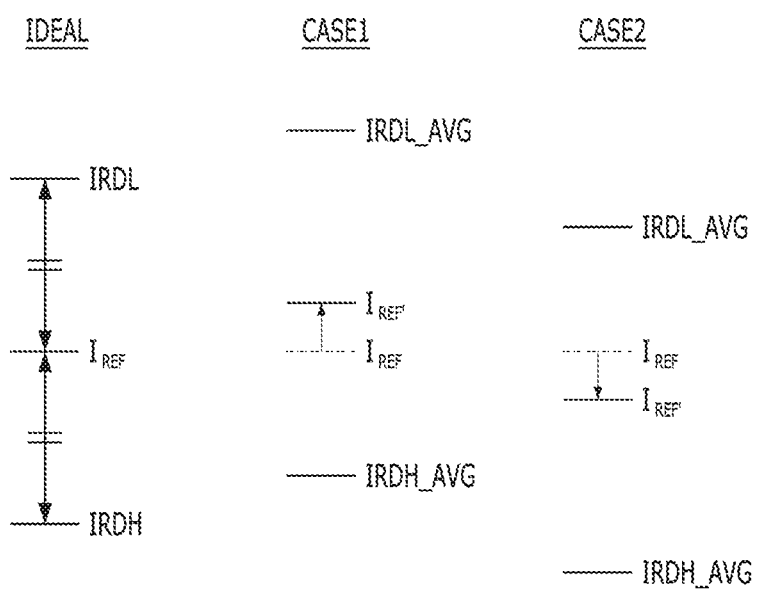
FIG. 5 is a representation of an example of a diagram to assist in the explanation of how a read margin is increased through a test operation in the memory circuit (device) of FIG. 4.

FIG. 5 is a representation of an example of a diagram to illustrate how a read margin may be increased through the test operation in the memory circuit (device) of FIG. 4.

Referring to FIG. 5, it is assumed that the current amount of the reference current IREF flowing through the sensing block 430 before adjustment is a first current amount $I_{REF}$. When the first current amount IREF is positioned at the very middle between a current amount IRDL of a current flowing through a resistive storage cell written with low data and a current amount IRDH of a current flowing through a resistive storage cell written with high data, the read margin of the sensing block 430 may be a maximum (see IDEAL).

First, it is assumed that it is detected through the test operation that the resistance values of the resistive storage cells included in the cell array 410 tend to be smaller than a general case (see CASE1). Also, in this case, it is assumed that an average value IRDL_AVG of current amounts flowing through the resistive storage cells written with low data and an average value IRDH_AVG of current amounts flowing through the resistive storage cells written with high data are as shown in FIG. 5. In this case, since the first current amount $I_{REF}$ is lopsided toward the average value IRDH_AVG, a read margin is decreased. Thus, the first current amount $I_{REF}$ of the reference current IREF may be increased to a second current amount $I_{REF'}$ to maximize the read margin.

Next, it is assumed that it is detected through the test operation that the resistance values of the resistive storage cells included in the cell array 410 tend to be larger than the general case (see CASE2). Also, in this case, it is assumed that an average value IRDL_AVG of current amounts flowing through the resistive storage cells written with low data and an average value IRDH_AVG of current amounts flowing through the resistive storage cells written with high data are as shown in FIG. 5. In this case, since the first current amount $I_{REF}$ is lopsided toward the average value IRDL_AVG, a read margin is decreased. Thus, the first current amount $I_{REF}$ of the reference current IREF may be decreased to a second current amount $I_{REF'}$ to maximize the read margin.

Under the above exemplary design, the memory circuit (device) of FIG. 4 may cause the read margin to be beneficially increased or maximized, by adjusting the current amount of the reference current $I_{REF}$ according to the average value of the current amounts of the test currents which are detected through the test operation.

Figure 6:
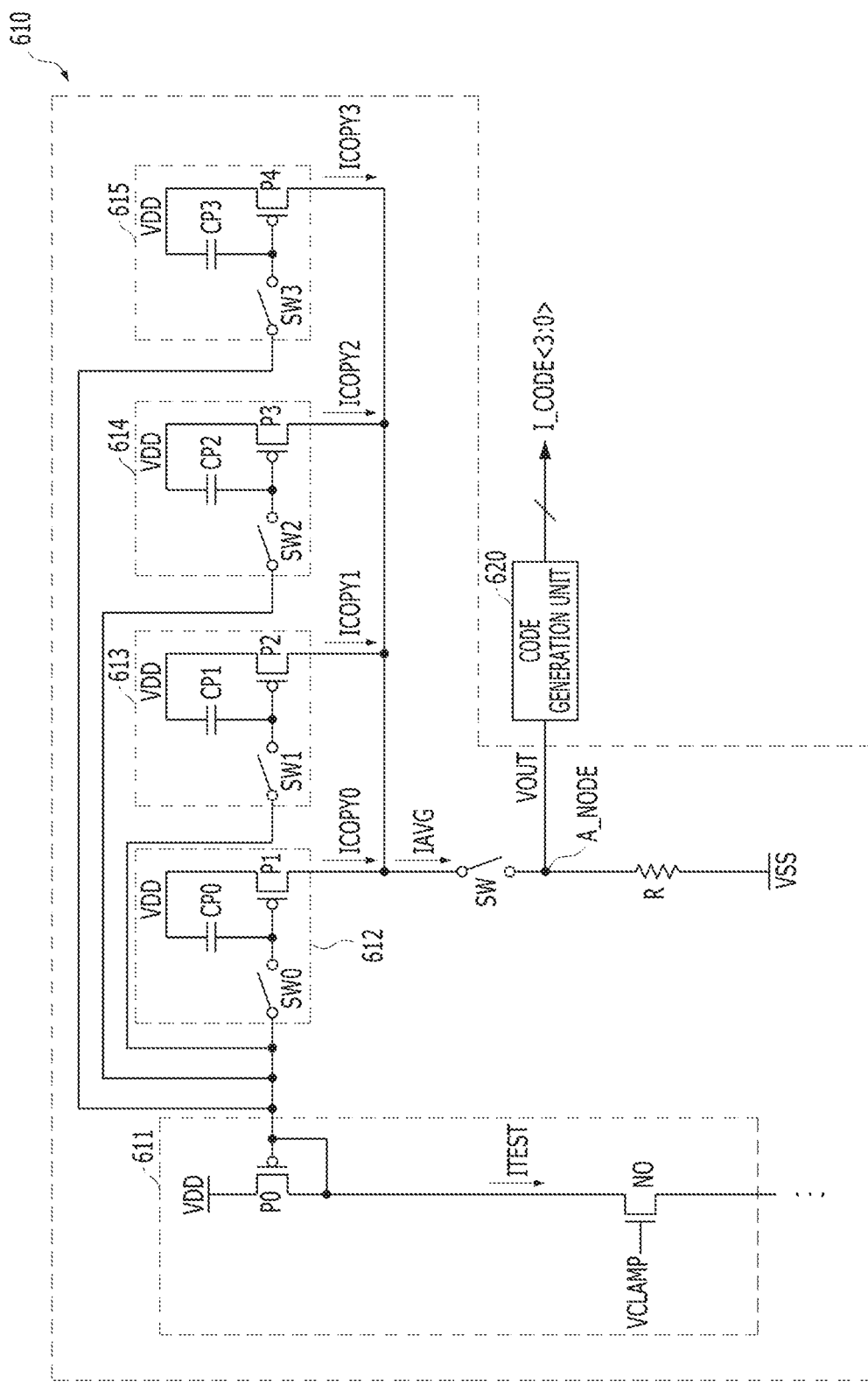
FIG. 6 is a configuration diagram illustrating a representation of an example of the current code generation block shown in FIG. 4.
Figure 7A:
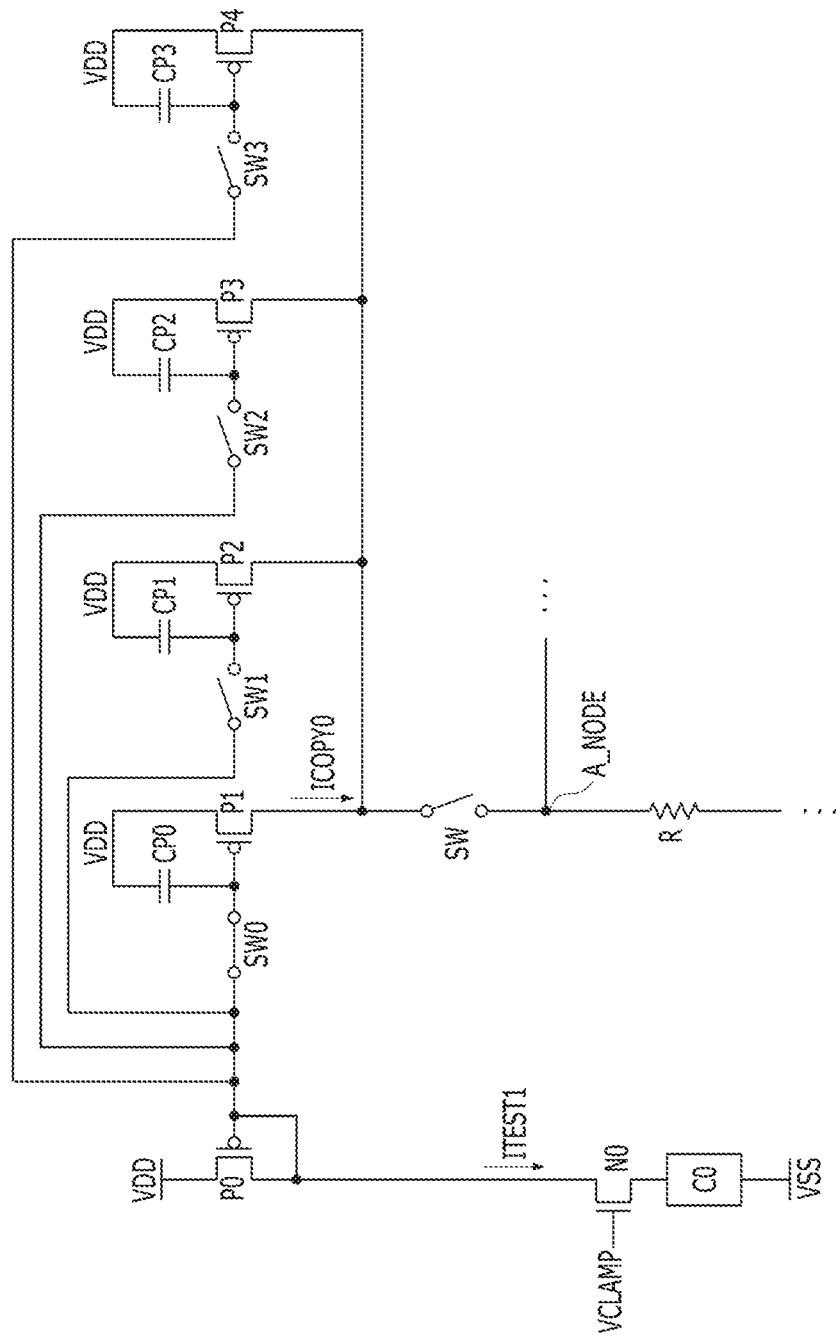
FIGS. 7A to 7E are representations of examples of diagrams to assist in the explanation of the operation of the average current generation unit shown in FIG. 6.
Figure 7B:
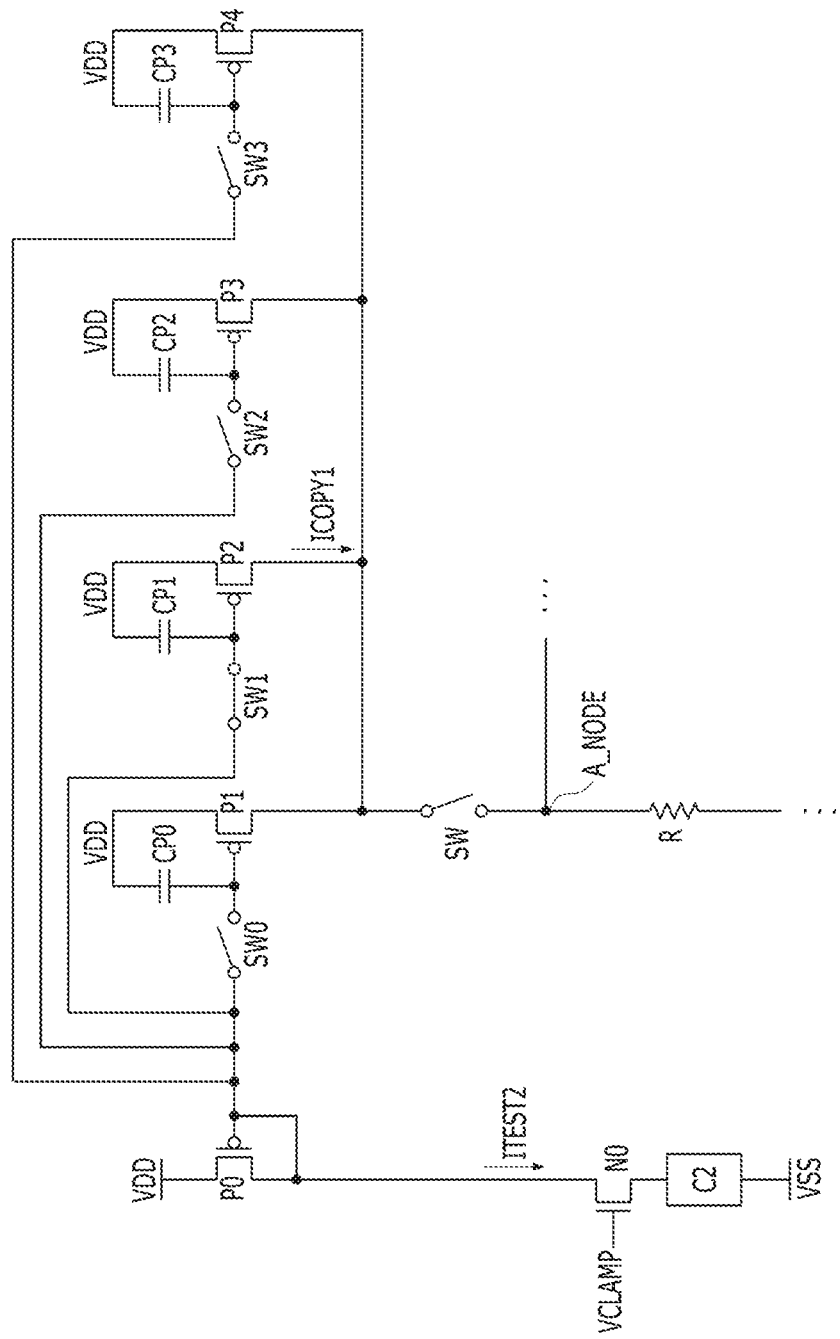
Figure 7C:
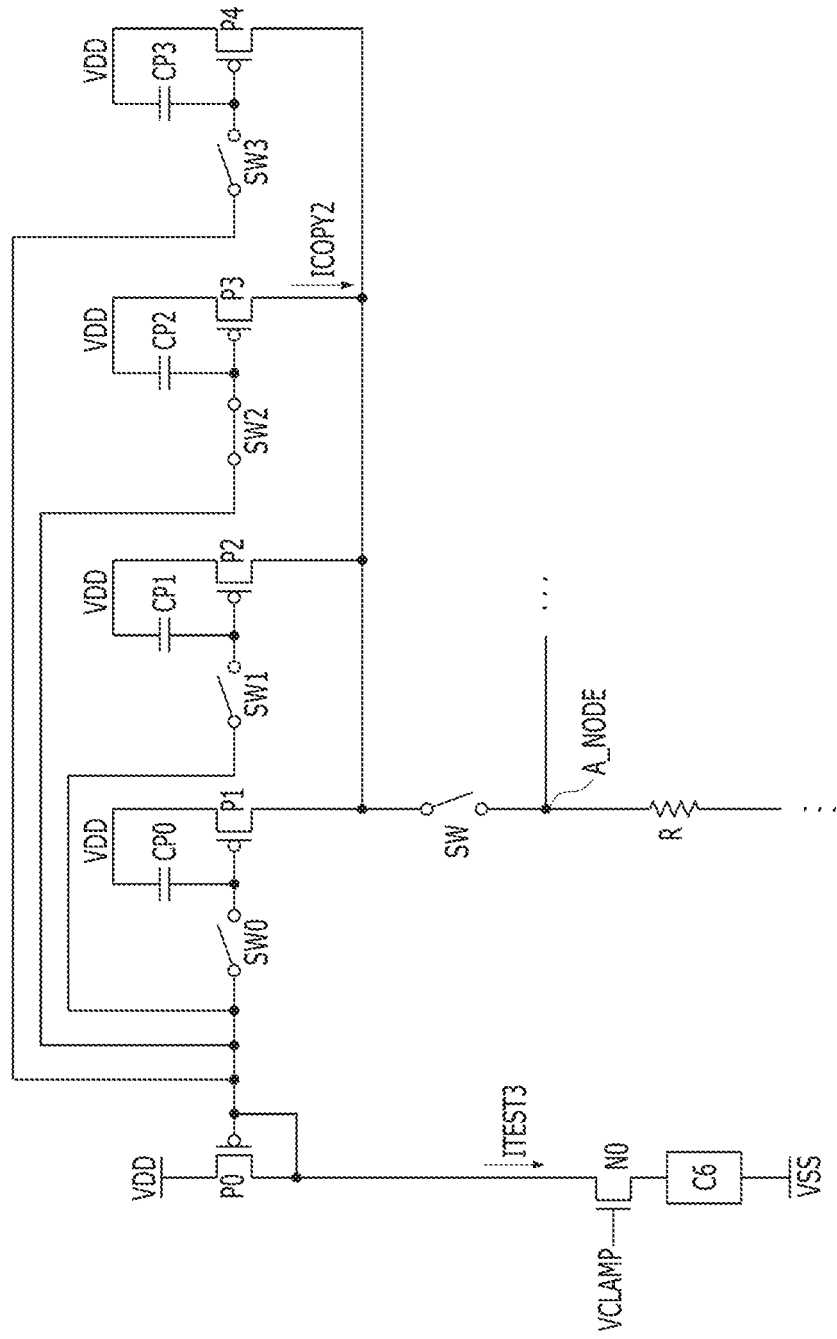
Figure 7D:
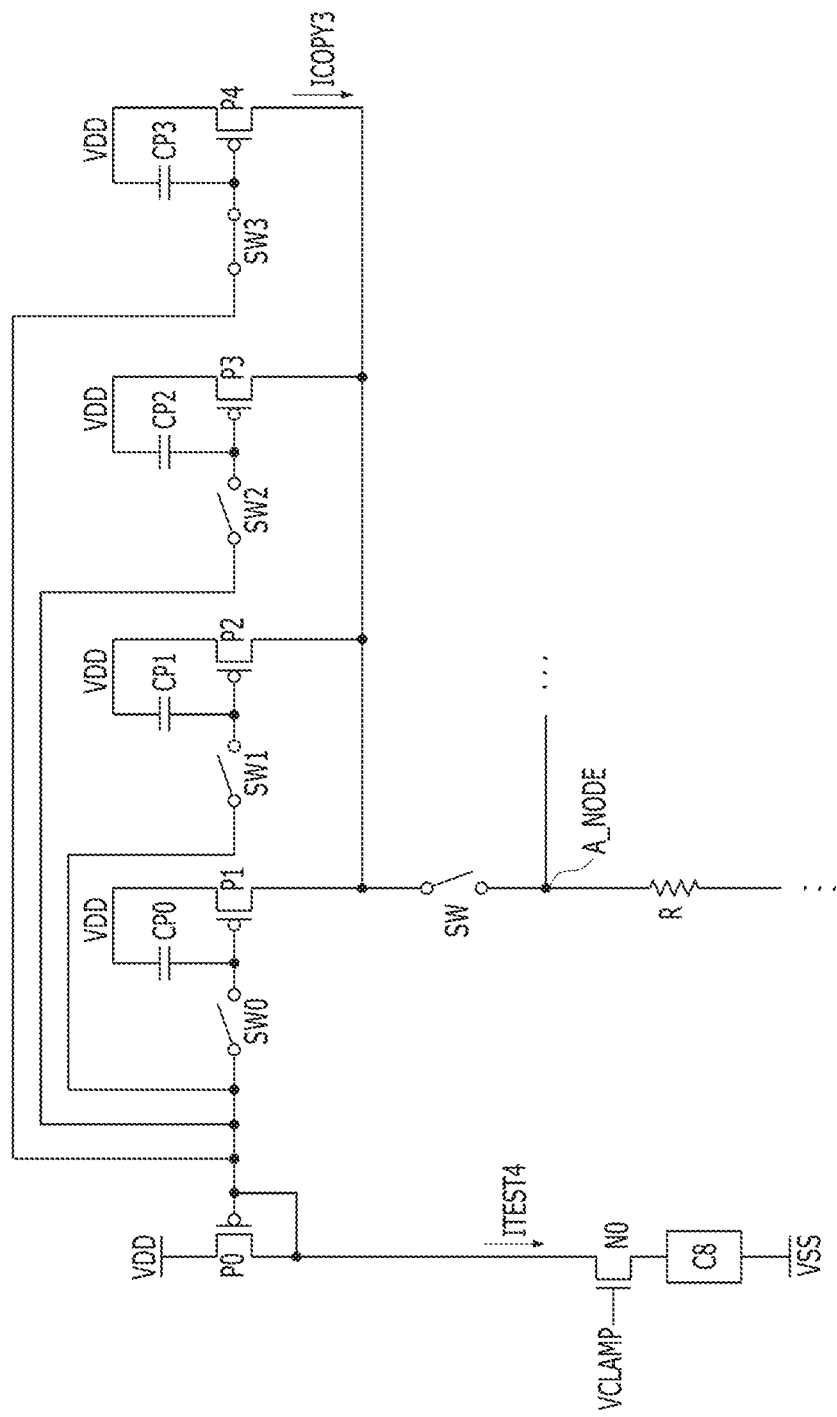
Figure 7E:
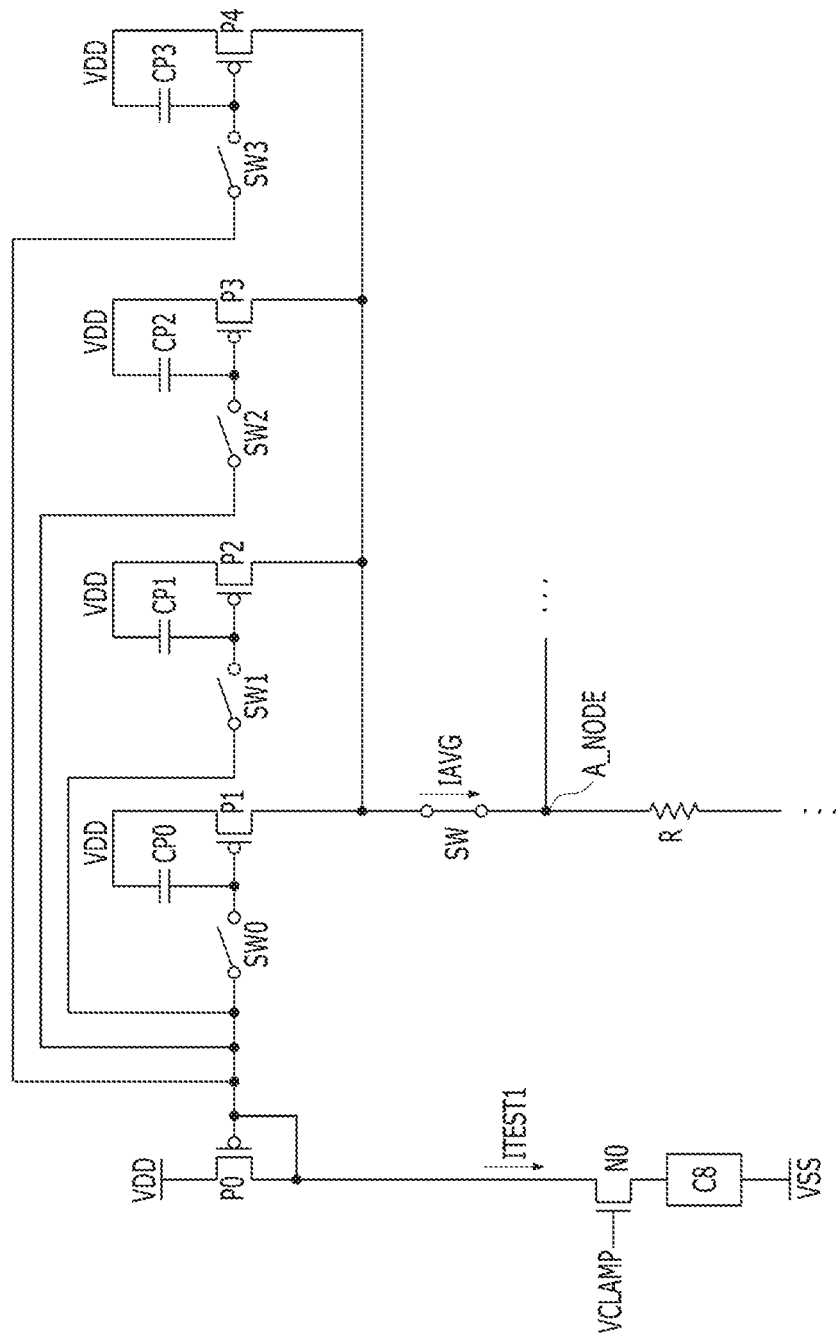

FIG. 6 is a configuration diagram illustrating a representation of an example of the current code generation block 420 shown in FIG. 4.

Referring to FIG. 6, the current code generation block 420 may include an average current generation unit 610 and a code generation unit 620.

The average current generation unit 610 may generate an average current IAVG which has a current amount corresponding to the average value of the current amounts of test currents respectively flowing through at least two resistive storage cells among the resistive storage cells C0 to C9 of the cell array 410, in the test operation.

The average current generation unit 610 may include a test current generating section 611 and current copy sections 612 to 615. The test current generating section 611 may include an NMOS transistor N0 and a PMOS transistor P0, and flow the test current ITEST which is predetermined, to a selected resistive storage cell in the test operation. The NMOS transistor N0 may be controlled by the clamp voltage VCLAMP.

In the case where the number of resistive storage cells to be used for sampling in the test operation is m (m is a natural number, m=4 in FIG. 6), the current copy sections 612 to 615 may generate copy currents ICOPY0 to ICOPY3 by copying the test currents ITEST flowing through selected resistive storage cells, by 1/m times. The average current IAVG may be a current which is generated by summing all the copy currents ICOPY0 to ICOPY3.

The respective current copy sections 612 to 615 may include capacitors CP0 to CP3, switches SW0 to SW3, and PMOS transistors P1 to P4. The current drivability of each of the PMOS transistors P1 to P4 may be 1/m times the current drivability of the PMOS transistor P0. This means that a current flowing through each of the PMOS transistors P1 to P4 is 1/m times a current flowing through the PMOS transistor P0 under the same operating condition. To this end, a design may be made such that the ratio of the size of each of the PMOS transistors P1 to P4 and the size of the PMOS transistor P0 becomes 1:m.

The average current IAVG generated by the average current generation unit 610 may be inputted to the code generation unit 620. The detailed operation of the average current generation unit 610 will be described below with reference to FIGS. 7A to 7E.

The code generation unit 620 may be inputted with the average current IAVG, and generate the current code I_CODE<3:0> which has a value corresponding to the current amount of the average current IAVG. The code generation unit 620 may output the current code I_CODE<3:0> which has the value corresponding to the current amount of the average current IAVG, when an enable signal EN is enabled after a predetermined time passes from a point of time at which the average current IAVG is inputted. For example, the value of the current code I_CODE<3:0> may be proportional to the current amount of the average current IAVG. The detailed operation of the code generation unit 620 will be described later with reference to FIG. 8. A switch SW may be a switch which is closed in the test operation. For reference, the reference symbol VDD may designate a power supply voltage, and the reference symbol VSS may designate the ground voltage.

FIGS. 7A to 7E illustrates examples of circuit operation diagrams to explain the operation of the average current generation unit 610.

At first step (FIG. 7A), the test current generating section 611 is coupled to the resistive storage cell C0, and flows the test current ITEST1 thereto. The current copy section 612 may copy the test current ITEST1 by ¼ times, and generate the copy current ICOPY0. Similarly to this, at second to fourth steps (FIG. 7B, FIG. 7C and FIG. 7D), the test currents ITEST2, ITEST3 and ITEST4 may be copied by ¼ times, and the copy currents ICOPY1, ICOPY2 and ICOPY3 may be generated. At fifth step (FIG. 7E), the average current generation unit 610 may sum the copy currents ICOPY0, ICOPY1, ICOPY2 and ICOPY3 at a node A_NODE, into the average current IAVG. Accordingly, the current amount of the average current IAVG may be the same as the sum of the current amounts of the copy currents ICOPY0, ICOPY1, ICOPY2 and ICOPY3, that is, the average value of the current amounts of the test currents ITEST1, ITEST2, ITEST3 and ITEST4.

Figure 8:
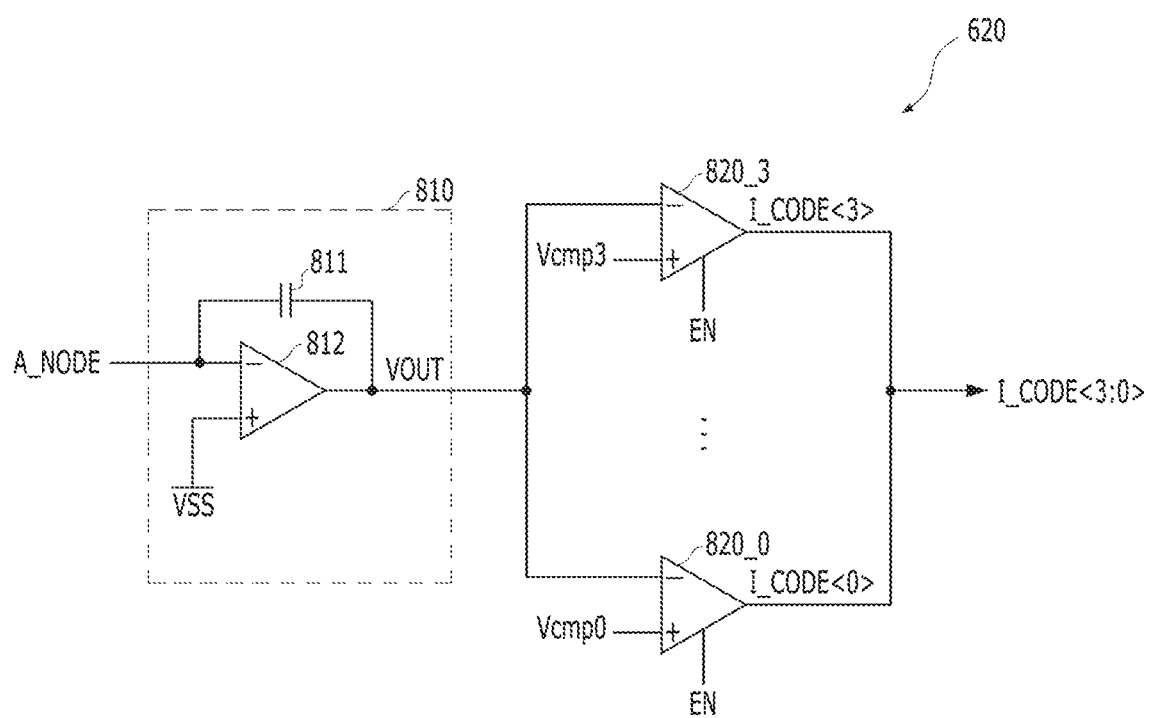
FIG. 8 is a configuration diagram illustrating a representation of an example of the code generation unit shown in FIG. 6.

FIG. 8 is a configuration diagram illustrating a representation of an example of the code generation unit 620.

Referring to FIG. 8, the code generation unit 620 may include an integrator 810 and a plurality of comparing sections 820_0 to 820_3.

The integrator 810 may integrate the average current IAVG according to a time, and generate an output voltage VOUT. The integrator 810 may include a capacitor 811 and a comparator 812.

The plurality of comparing sections 820_0 to 820_3 may compare the output voltage VOUT and a plurality of respective comparison voltages Vcmp0 to Vcmp3 which have different levels, after a predetermined time passes from a time at which the integration of the integrator 810 is started, and generate corresponding bits among the plurality of bits I_CODE<0> to I_CODE<3> included in the current code I_CODE<3:0>. The comparing sections 820_0 to 820_3 may output '0' if the output voltage VOUT is smaller than the corresponding comparison voltages Vcmp0 to Vcmp3 when the enable signal EN is enabled, and output '1' when the output voltage VOUT is larger than the corresponding comparison voltages Vcmp0 to Vcmp3 when the enable signal EN is enabled. A voltage level may rise from the comparison voltage Vcmp0 to the comparison voltage Vcmp3.

Figure 9:
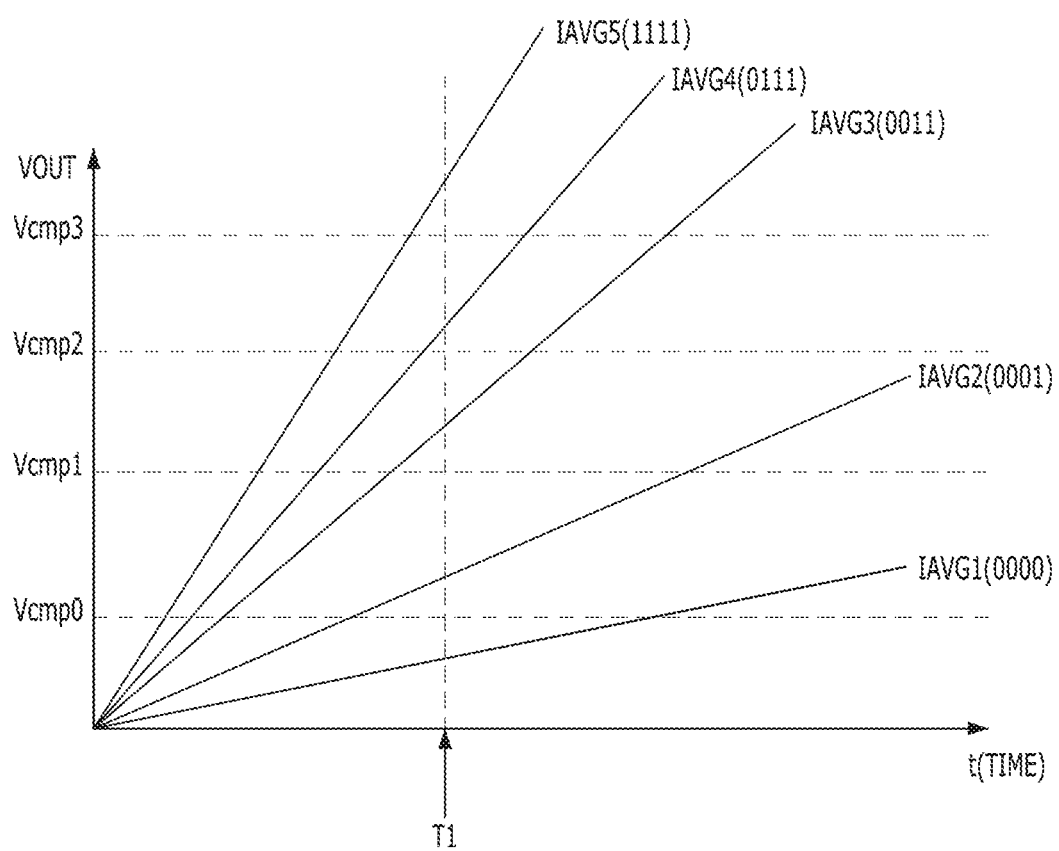
FIG. 9 is a representation of an example of a diagram to assist in the explanation of a method for generating a current code in the code generation unit.

FIG. 9 is a representation of an example of a diagram to explain a method for generating the current code I_CODE<3:0> in the code generation unit 620.

Referring to FIG. 9, the output voltage VOUT of the integrator 810 may increase according to a time t with a slope proportional to the current amount of the average current IAVG. Accordingly, the slope of the output voltage VOUT may increase as the current amount of the average current IAVG is large, and decrease as the current amount of the average current IAVG is small.

If the enable signal EN is enabled at a predetermined point of time T1, a result of comparing the output voltage VOUT and the comparison voltages Vcmp0 to Vcmp3 at the point of time T1 may be outputted. Consequently, such a comparison result may be changed depending upon the slope of the output voltage VOUT, that is, the current amount of the average current IAVG.

FIG. 9 shows changes of the output voltage VOUT according to a time when the current amount of the average current IAVG is changed. The current code I_CODE<3:0> becomes '0000' in the case where the current amount of the average current IAVG is a first value IAVG1, the current code I_CODE<3:0> becomes '0001' in the case where the current amount of the average current IAVG is a second value IAVG2, the current code I_CODE<3:0> becomes '0011' in the case where the current amount of the average current IAVG is a third value IAVG3, the current code I_CODE<3:0> becomes '0111' in the case where the current amount of the average current IAVG is a fourth value IAVG4, and the current code I_CODE<3:0> becomes '1111' in the case where the current amount of the average current IAVG is a fifth value IAVG5 (the first value<the second value<the third value<the fourth value<the fifth value).

While FIG. 9 illustrates a specific implementation example where the current code I_CODE<3:0> is 4 bits, the number of bits of the current code I_CODE<3:0> may be different and set based on specific needs or requirements for a design or application.

Figure 10:
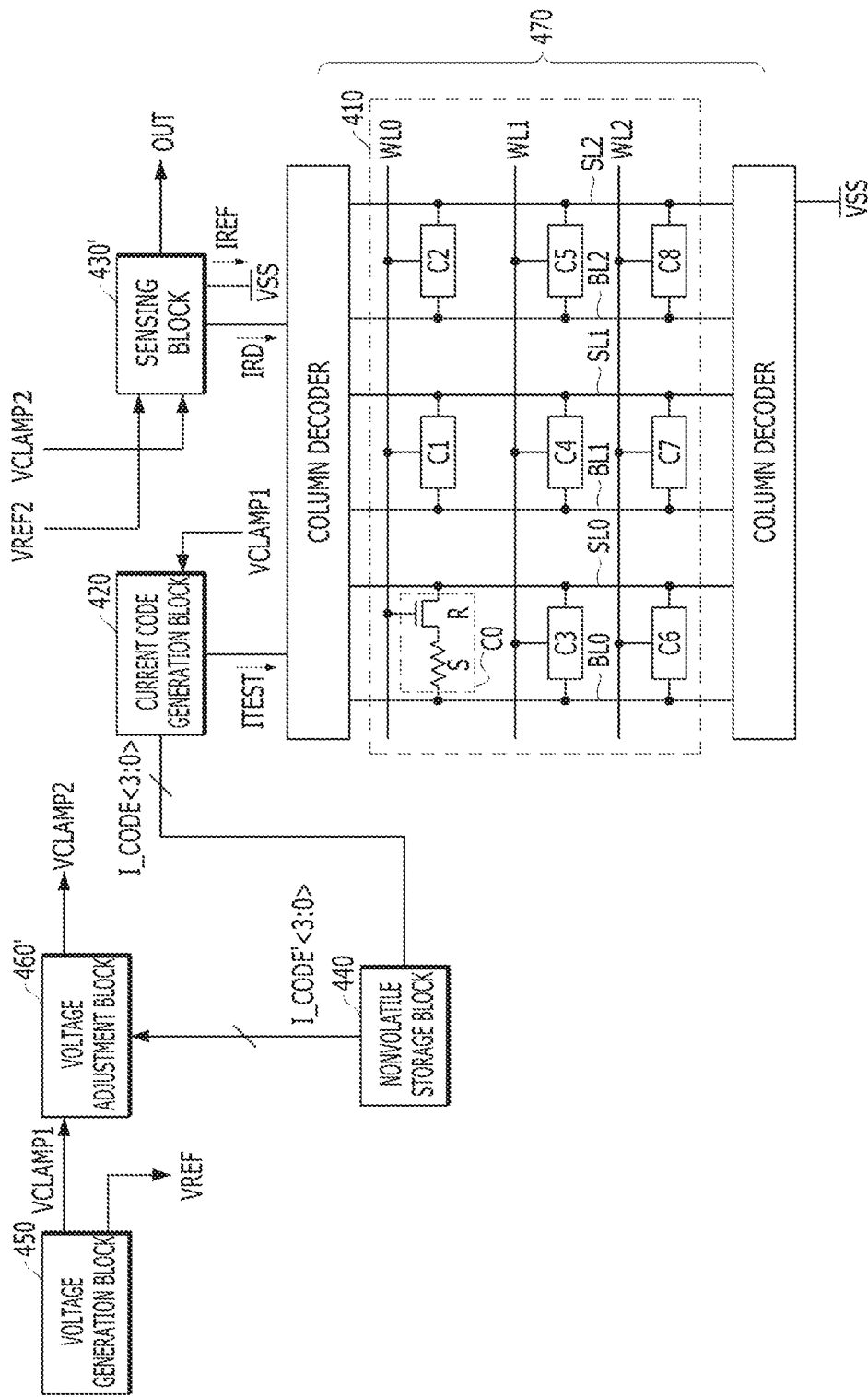
FIG. 10 is a configuration diagram illustrating a representation of an example of a memory circuit (device) including variable resistance elements.

FIG. 10 is a configuration diagram illustrating a representation of an example of a memory circuit (device) including variable resistance elements. The memory circuit (device) of FIG. 10 may adjust the current amount of a read current IRD by using current codes I_CODE<3:0> and thus is different from the memory circuit (device) of FIG. 4 in this aspect while sharing various common features with the design in FIG. 4.

In FIG. 10, a sensing block 430' may compare a read current IRD flowing through a resistive storage cell selected among resistive storage cells C0 to C8 with a reference current $I_{REF}$, and thereby sense the data of the selected resistive storage cell. In the memory circuit (device) shown in FIG. 10, the current amount of the read current IRD may be adjusted according to the value of a current code I_CODE'<3:0> outputted from a nonvolatile storage block 440. The sensing block 430' may output the data of the selected resistive storage cell as low data OUT if the current amount of the read current IRD is larger than the current amount of the reference current $I_{REF}$, and output the data of the selected resistive storage cell as high data OUT if the current amount of the read current IRD is smaller than the current amount of the reference current $I_{REF}$.

A voltage adjustment block 460' may adjust the voltage level of a first clamp voltage VCLAMP1 according to the value of the current code I_CODE'<3:0>, and generate a second clamp voltage VCLAMP2. For example, in the case where the value of the current code I_CODE'<3:0> increases as the average value of the current amounts of test currents ITEST is large, that is, in the case where the average value of the current amounts of test currents ITEST and the value of the current code I_CODE'<3:0> are proportional to each other, the voltage adjustment block 460' may lower the voltage level of the second clamp voltage VCLAMP2 as the value of the current code I_CODE'<3:0> increases and may increase the voltage level of the second clamp voltage VCLAMP2 as the value of the current code I_CODE'<3:0> decreases. The current amount of the read current IRD may be increased as the voltage level of the second clamp voltage VCLAMP2 is increased, and may be decreased as the voltage level of the second clamp voltage VCLAMP2 is lowered.

Figure 11:
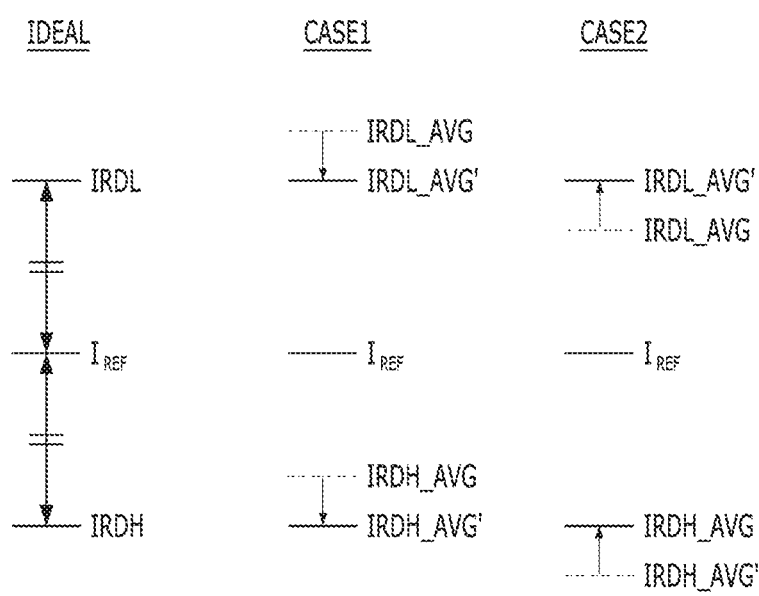
FIG. 11 is a representation of an example of a diagram to assist in the explanation of how a read margin is increased through a test operation in the memory circuit (device) of FIG. 10.

FIG. 11 is a representation of an example of a diagram to assist in the explanation of how a read margin is increased through a test operation in the memory circuit (device) of FIG. 10.

Referring to FIG. 11, it is assumed that the current amount of the reference current IREF flowing through the sensing block 430' before adjustment is a current amount $I_{REF}$. When the current amount $I_{REF}$ is positioned at the very middle between a current amount IRDL of a current flowing through a resistive storage cell written with low data and a current amount IRDH of a current flowing through a resistive storage cell written with high data, the read margin of the sensing block 430' may be a maximum (see IDEAL).

First, it is assumed that it is detected through the test operation that the resistance values of the resistive storage cells included in a cell array 410 tend to be smaller than a general case (see CASE1). Also, in this case, it is assumed that an average value IRDL_AVG of current amounts flowing through the resistive storage cells written with low data and an average value IRDH_AVG of current amounts flowing through the resistive storage cells written with high data are as shown in FIG. 11. In this case, since the current amount $I_{REF}$ is lopsided toward the average value IRDH_AVG, a read margin is decreased. Thus, the average values IRDL_AVG and IRDH_AVG of the current amounts may be decreased to new average values IRDL_AVG' and IRDH_AVG' of current amounts to maximize the read margin.

Next, it is assumed that it is detected through the test operation that the resistance values of the resistive storage cells included in the cell array 410 tend to be larger than the general case (see CASE2). Also, in this case, it is assumed that an average value IRDL_AVG of current amounts flowing through the resistive storage cells written with low data and an average value IRDH_AVG of current amounts flowing through the resistive storage cells written with high data are as shown in FIG. 11. In this case, since the current amount $I_{REF}$ is lopsided toward the average value IRDL_AVG, a read margin is decreased. Thus, the average values IRDL_AVG and IRDH_AVG of the current amounts may be increased to new average values IRDL_AVG and IRDH_AVG of current amounts to maximize the read margin.

In this way, the memory circuit (device) of FIG. 10 may cause the read margin to be maximized, by adjusting the current amount of the read current IRD according to the average value of the current amounts of test currents which are detected through the test operation.

Figure 12:
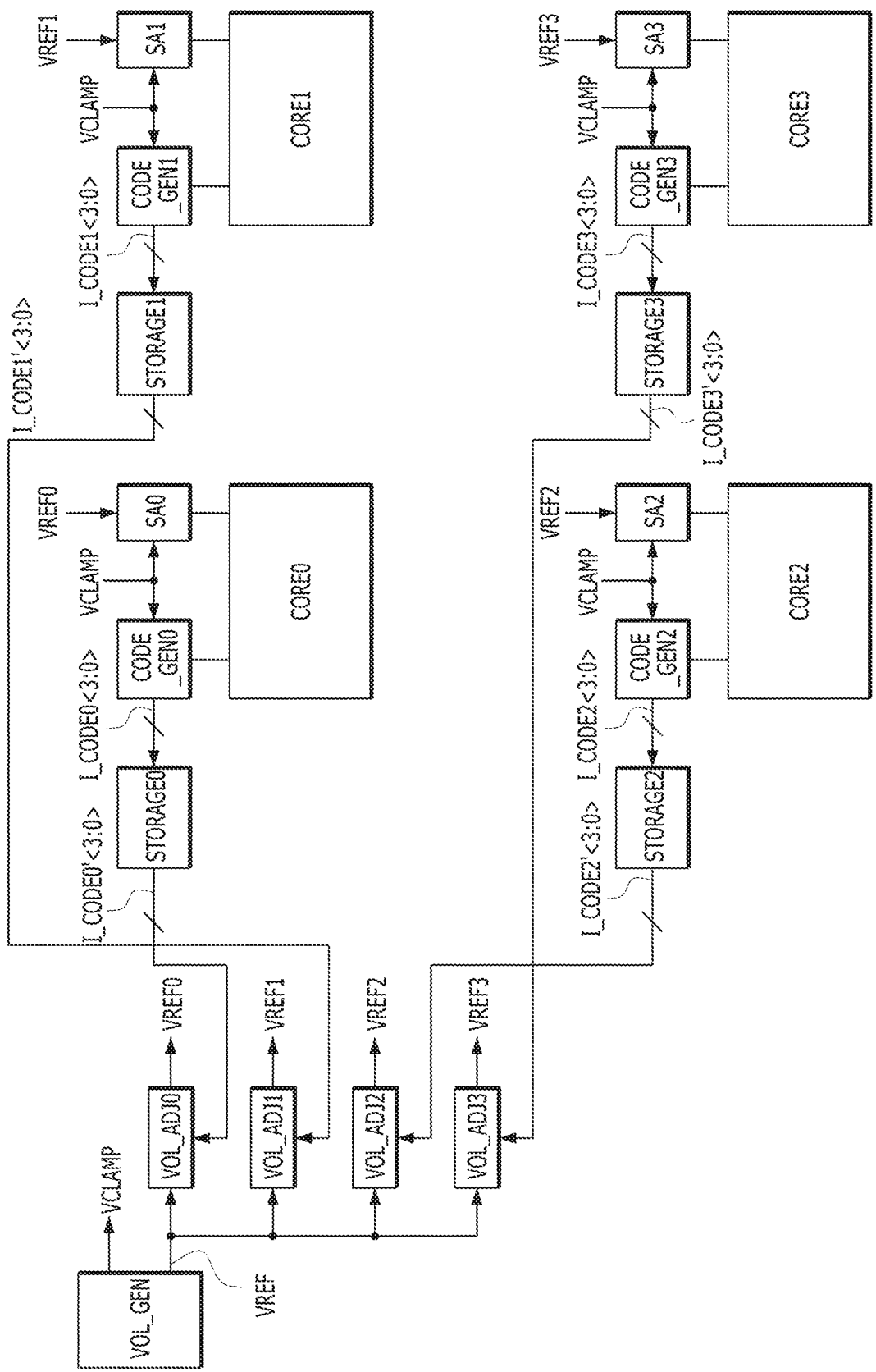
FIG. 12 is a configuration diagram illustrating a representation of an example of a memory circuit (device) including variable resistance elements.

FIG. 12 is a configuration diagram illustrating a representation of an example of a memory circuit (device) including variable resistance elements.

Referring to FIG. 12, the memory circuit (device) may include a plurality of core blocks CORE0 to CORE3, a plurality of code generation blocks CODE_GEN0 to CODE_GEN3, a plurality of sensing blocks SA0 to SA3, a plurality of nonvolatile storage blocks STORAGE0 to STORAGE3, a voltage generation block VOL_GEN, and a plurality of voltage adjustment blocks VOL_ADJ0 to VOL_ADJ3.

Each of the core blocks CORE0 to CORE3 shown in FIG. 12 may correspond to a configuration which results from combining the cell array 410 and the column decoder 470 in the memory circuit (device) shown in FIG. 4. By including the plurality of core blocks CORE0 to CORE3, the plurality of code generation blocks CODE_GEN0 to CODE_GEN3, the plurality of nonvolatile storage blocks STORAGE0 to STORAGE3 and the plurality of voltage adjustment blocks VOL_ADJ0 to VOL_ADJ3, the memory circuit (device) of FIG. 12 may generate and store current codes I_CODE0<3:0> to I_CODE3<3:0> corresponding to the respective core blocks CORE0 to CORE3. Moreover, the memory circuit (device) of FIG. 12 may generate reference voltages VREF0 to VREF3 by adjusting a reference voltage VREF to voltage levels corresponding to respective stored current codes I_CODE0'<3:0> to I_CODE3'<3:0>, and adjust the current amounts of reference currents IREF0 to IREF3 of the respective core blocks CORE0 to CORE3 to conform to the characteristics of the respective core blocks CORE0 to CORE3, by using the reference voltages VREF0 to VREF3. Accordingly, the read margins of the respective core blocks CORE0 to CORE3 may be maximized. A test operation and a reference current adjustment operation for each of the core blocks CORE0 to CORE3 are the same as described above with reference to FIG. 4.

Figure 13:
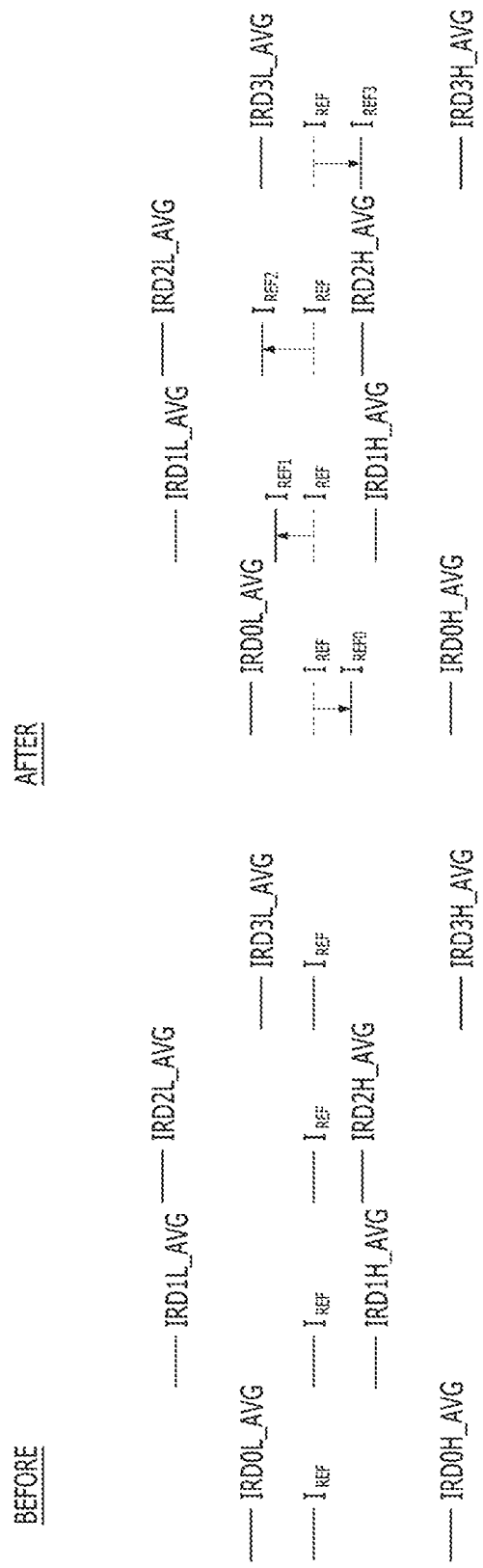
FIG. 13 is a representation of an example of a diagram to assist in the explanation of how a read margin is increased through a test operation in the memory circuit (device) of FIG. 12.

FIG. 13 is a representation of an example of a diagram to assist in the explanation of how a read margin is increased through a test operation in the memory circuit (device) of FIG. 12.

Referring to FIG. 13, it is assumed that the current amounts of the respective reference currents IREF0 to IREF3 flowing through the respective sensing blocks SA0 to SA3 before adjustment are the same as $I_{REF}$. It is assumed that the average values of the current amounts of currents flowing through resistive storage cells written with low data in the core blocks CORE0 to CORE3 are IRD0L_AVG to IRD3L_AVG, respectively, and the average values of the current amounts of currents flowing through resistive storage cells written with high data in the core blocks CORE0 to CORE3 are IRD0H_AVG to IRD3H_AVG, respectively (see BEFORE).

Through the test operation, it is possible to detect that the sizes of the resistive storage cells included in the respective core blocks CORE0 to CORE3 have which tendencies, and the current amounts of the respective reference currents IREF0 to IREF3 may be changed to IREF0 to IREF3, by reflecting the tendencies on the reference currents IREF0 to IREF3 flowing through the respective sensing blocks SA0 to SA3 through using the current codes I_CODE0<3:0> to I_CODE3<3:0>. Through such current amount adjustment, it is possible to cause the current amounts IREF0 to IREF3 to be positioned at the very middle between the average values IRD0L_AVG to IRD3L_AVG and IRD0H_AVG to IRD3H_AVG, whereby read margins may be maximized in the respective core blocks CORE0 to CORE3 (see AFTER).

Figure 14:
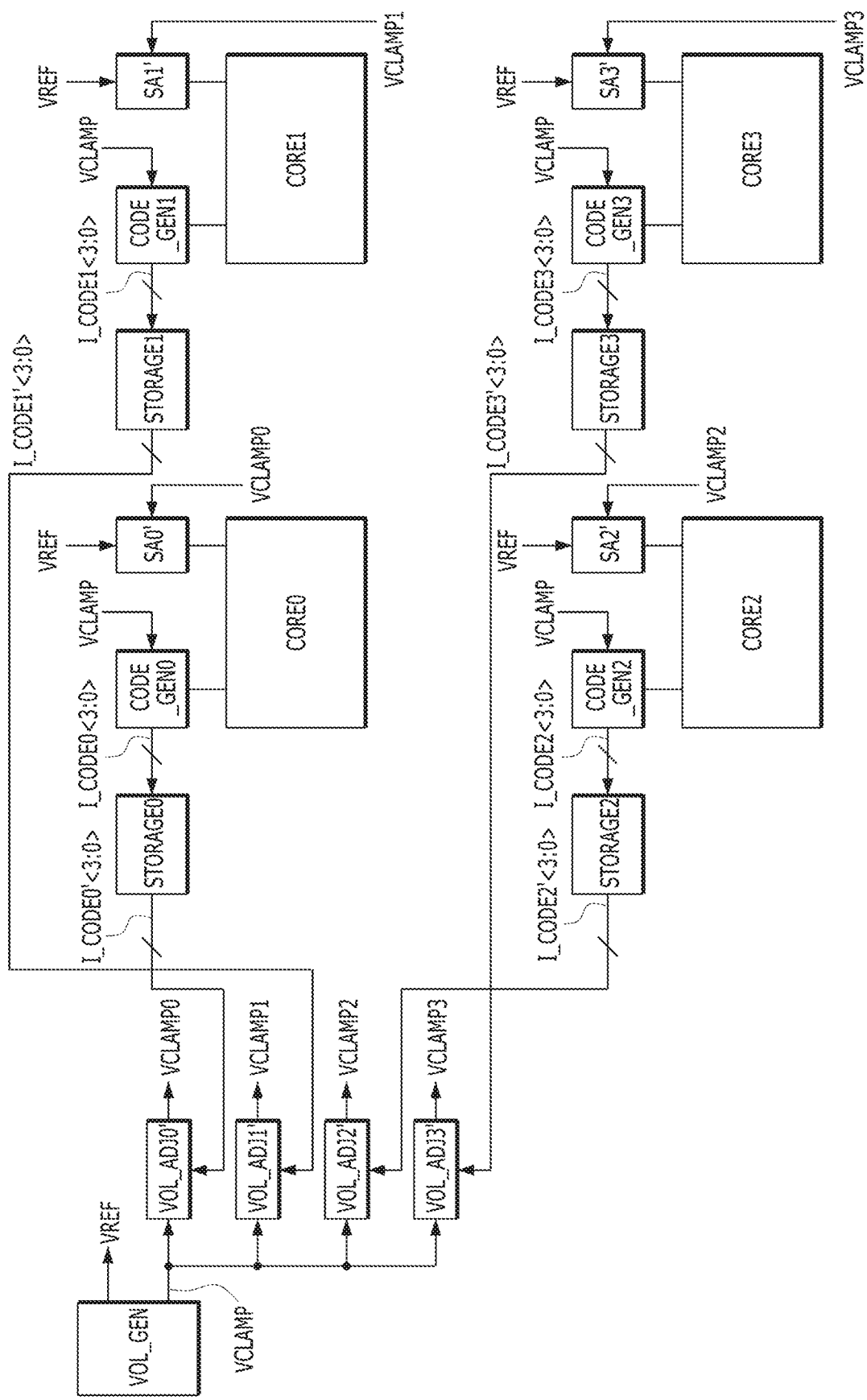
FIG. 14 is a configuration diagram illustrating a representation of an example of a memory circuit (device) including variable resistance elements.

FIG. 14 is a configuration diagram illustrating a representation of an example of a memory circuit (device) including variable resistance elements. The memory circuit (device) may include a plurality of core blocks CORE0 to CORE3, a plurality of code generation blocks CODE_GEN0 to CODE_GEN3, a plurality of sensing blocks SA0' to SA3', a plurality of nonvolatile storage blocks STORAGE0 to STORAGE3, a voltage generation block VOL_GEN, and a plurality of voltage adjustment blocks VOL_ADJ0' to VOL_ADJ3'.

Each of the core blocks CORE0 to CORE3 shown in FIG. 14 may correspond to a configuration which results from combining the cell array 410 and the column decoder 470 in the memory circuit (device) shown in FIG. 10. By including the plurality of core blocks CORE0 to CORE3, the plurality of code generation blocks CODE_GEN0 to CODE_GEN3, the plurality of nonvolatile storage blocks STORAGE0 to STORAGE3 and the plurality of voltage adjustment blocks VOL_ADJ0' to VOL_ADJ3', the memory circuit (device) of FIG. 14 may generate and store current codes I_CODE0<3:0> to I_CODE3<3:0> corresponding to the respective core blocks CORE0 to CORE3. Moreover, the memory circuit (device) of FIG. 14 may generate clamp voltages VCLAMP0 to VCLAMP3 by adjusting a clamp voltage VCLAMP to voltage levels corresponding to respective stored current codes I_CODE0'<3:0> to I_CODE3'<3:0>, and adjust the current amounts of read currents IRD0 to IRD3 of the respective core blocks CORE0 to CORE3 to conform to the characteristics of the respective core blocks CORE0 to CORE3, by using the clamp voltages VCLAMP0 to VCLAMP3. Accordingly, the read margins of the respective core blocks CORE0 to CORE3 may be maximized. A test operation and a read current adjustment operation for each of the core blocks CORE0 to CORE3 are the same as described above with reference to FIG. 10.

Figure 15:
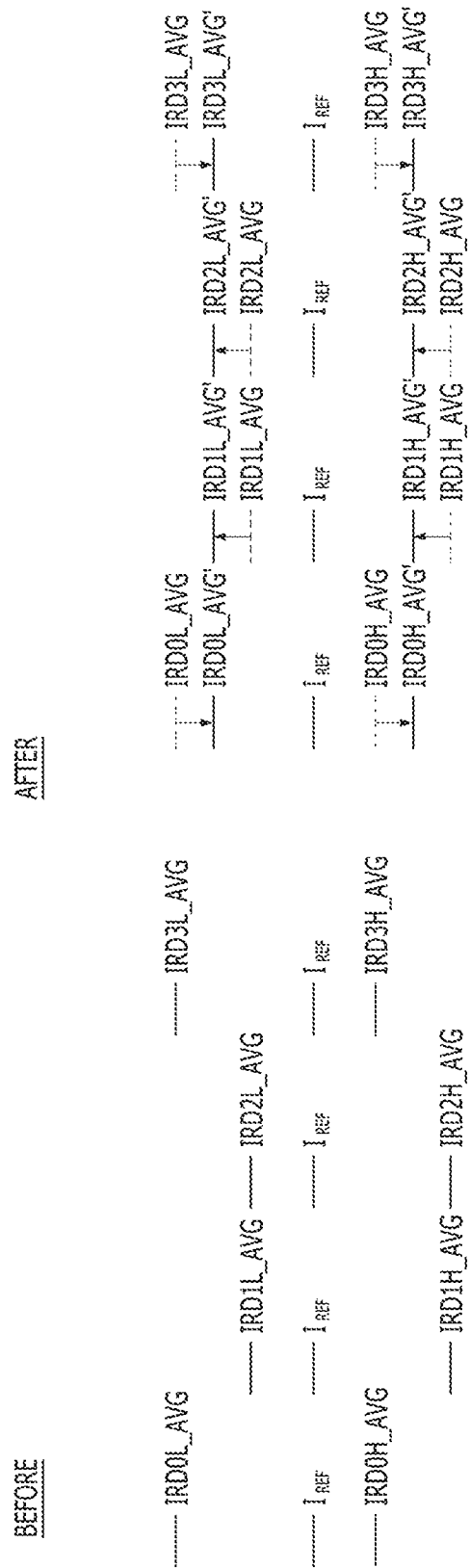
FIG. 15 is a representation of an example of a diagram to assist in the explanation of how a read margin is increased through a test operation in the memory circuit (device) of FIG. 14.

FIG. 15 is a representation of an example of a diagram to assist in the explanation of how a read margin is increased through a test operation in the memory circuit (device) of FIG. 14.

Referring to FIG. 15, it is assumed that the current amounts of reference currents IREF flowing through the respective sensing blocks SA0' to SA3' are IREF, the average values of the current amounts of currents flowing through resistive storage cells written with low data in the core blocks CORE0 to CORE3 before adjustment are IRD0L_AVG to IRD3L_AVG, respectively, and the average values of the current amounts of currents flowing through resistive storage cells written with high data in the core blocks CORE0 to CORE3 before adjustment are IRD0H_AVG to IRD3H_AVG, respectively (see BEFORE).

Through the test operation, it is possible to detect that the sizes of the resistive storage cells included in the respective core blocks CORE0 to CORE3 have which tendencies, and the average values of the current amounts of the respective read currents IRD0 to IRD3 may be changed to IRD0L_AVG' to IRD3L_AVG' and IRD0H_AVG' to IRD3H_AVG', by reflecting the tendencies on the read currents IRD0 to IRD3 flowing through the respective sensing blocks SA0' to SA3' through using the current codes I_CODE0<3:0> to I_CODE3<3:0>. Through such current amount adjustment, it is possible to cause the current amounts IREF to be positioned at the very middle between the average values IRD0L_AVG to IRD3L_AVG and IRD0H_AVG to IRD3H_AVG', whereby read margins may be maximized in the respective core blocks CORE0 to CORE3 (see AFTER).

Figure 16:
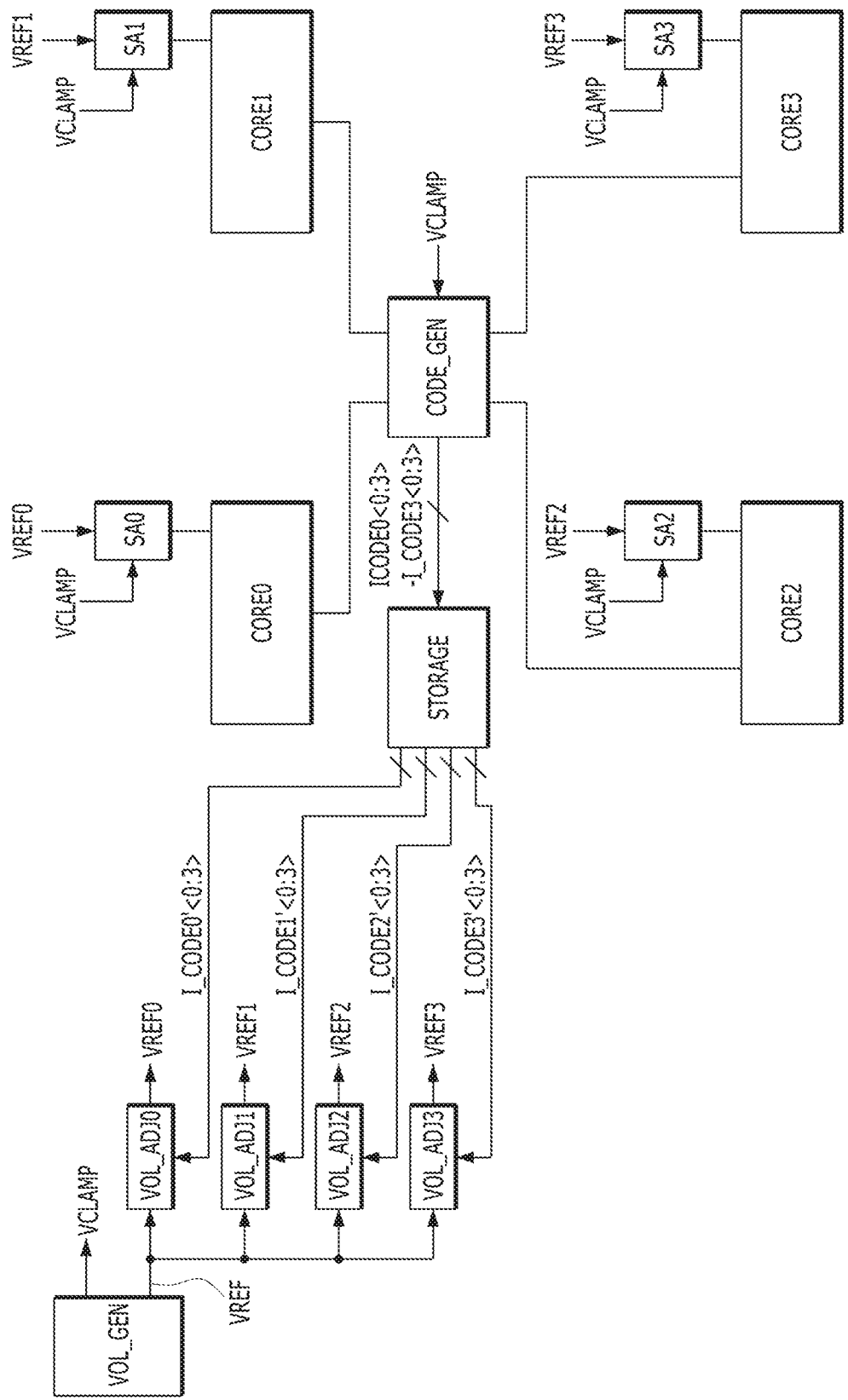
FIG. 16 is a configuration diagram illustrating a representation of an example of a memory circuit (device) including variable resistance elements.

FIG. 16 is a configuration diagram illustrating a representation of an example of a memory circuit (device) including variable resistance elements.

Referring to FIG. 16, the memory circuit (device) may include a plurality of core blocks CORE0 to CORE3, a code generation block CODE_GEN, a plurality of sensing blocks SA0 to SA3, a nonvolatile storage block STORAGE, a voltage generation block VOL_GEN, and a plurality of voltage adjustment blocks VOL_ADJ0 to VOL_ADJ3.

Each of the core blocks CORE0 to CORE3 shown in FIG. 16 may correspond to a configuration which results from combining the cell array 410 and the column decoder 470 in the memory circuit (device) shown in FIG. 4. The memory circuit (device) of FIG. 16 includes the plurality of core blocks CORE0 to CORE3 and the plurality of voltage adjustment blocks VOL_ADJ0 to VOL_ADJ3, and the plurality of core blocks CORE0 to CORE3 share the code generation block CODE_GEN and the nonvolatile storage block STORAGE. The code generation block CODE_GEN may generate current codes I_CODE0<3:0> to I_CODE3<3:0> corresponding to the respective core blocks CORE0 to CORE3, and store the current codes I_CODE0<3:0> to I_CODE3<3:0> in the nonvolatile storage block STORAGE. Moreover, the memory circuit (device) of FIG. 16 may generate reference voltages VREF0 to VREF3 by adjusting a reference voltage VREF to voltage levels corresponding to respective stored current codes I_CODE0'<3:0> to I_CODE3'<3:0>, and adjust the current amounts of reference currents IREF0 to IREF3 of the respective core blocks CORE0 to CORE3 to conform to the characteristics of the respective core blocks CORE0 to CORE3, by using the reference voltages VREF0 to VREF3. Accordingly, the read margins of the respective core blocks CORE0 to CORE3 may be maximized. A test operation and a read current adjustment operation for each of the core blocks CORE0 to CORE3 are the same as described above with reference to FIG. 4.

One difference between the memory device of FIG. 16 and the memory device of FIG. 12 resides in that a plurality of core blocks share a code generation block such that it is possible to decrease differences in code values that are likely to be induced by the circuit characteristics of respective code generation blocks in the case of using a plurality of code generation blocks.

Figure 17:
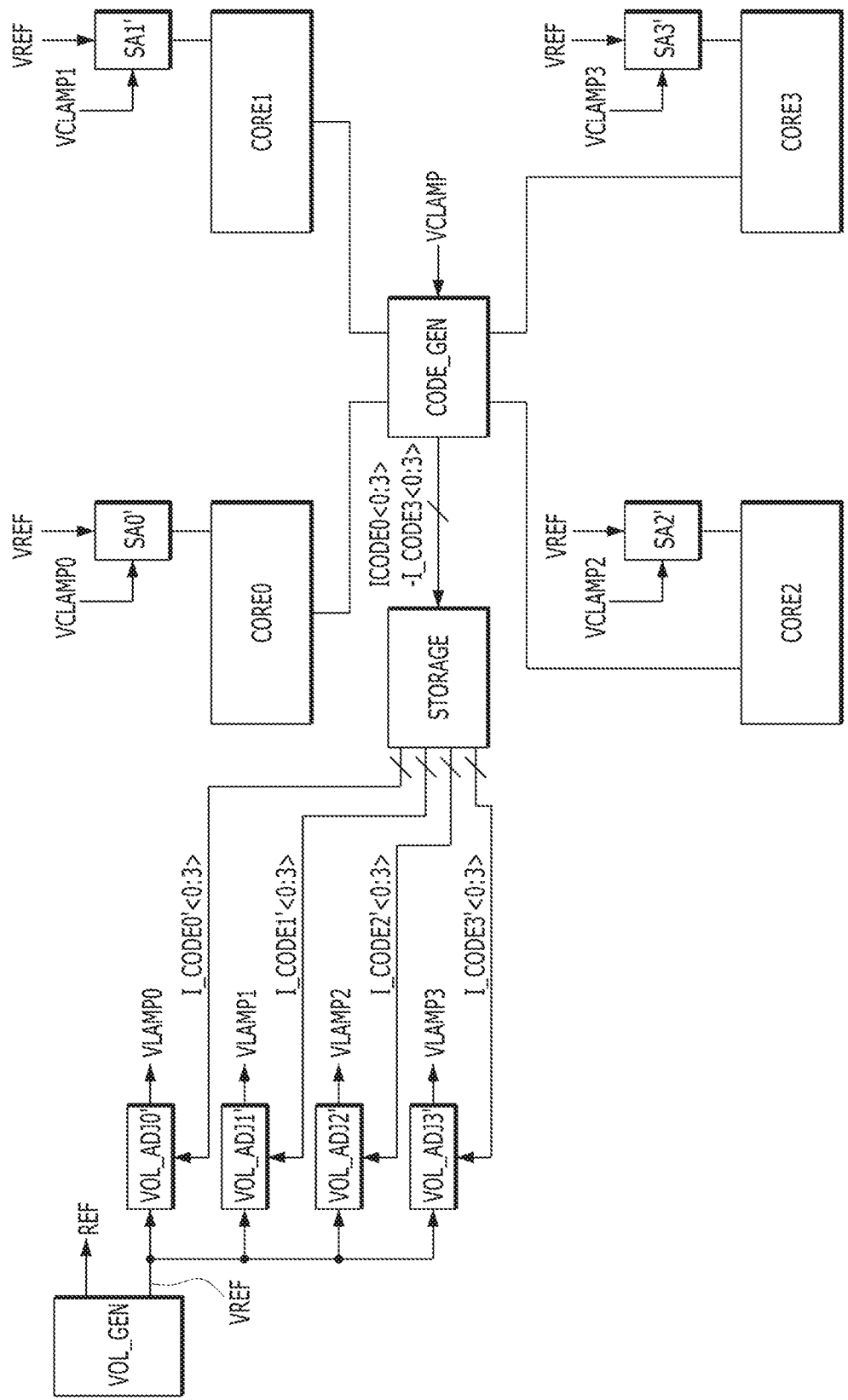
FIG. 17 is a configuration diagram illustrating a representation of an example of a memory circuit (device) including variable resistance elements.

FIG. 17 is a configuration diagram illustrating a representation of an example of a memory circuit (device) including variable resistance elements. The memory circuit (device) may include a plurality of core blocks CORE0 to CORE3, a code generation block CODE_GEN, a plurality of sensing blocks SA0' to SA3', a nonvolatile storage block STORAGE, a voltage generation block VOL_GEN, and a plurality of voltage adjustment blocks VOL_ADJ0' to VOL_ADJ3'.

In some implementations, each of the core blocks CORE0 to CORE3 shown in FIG. 17 may correspond to a configuration which results from combining the cell array 410 and the column decoder 470 in the memory circuit (device) shown in FIG. 10. The memory circuit (device) of FIG. 17 includes the plurality of core blocks CORE0 to CORE3 and the plurality of voltage adjustment blocks VOL_ADJ0 to VOL_ADJ3, and the plurality of core blocks CORE0 to CORE3 share the code generation block CODE_GEN and the nonvolatile storage block STORAGE. The code generation block CODE_GEN may generate current codes I_CODE0<3:0> to I_CODE3<3:0> corresponding to the respective core blocks CORE0 to CORE3, and store the current codes I_CODE0<3:0> to I_CODE3<3:0> in the nonvolatile storage block STORAGE. Moreover, the memory circuit (device) of FIG. 17 may generate clamp voltages VCLAMP0 to VCLAMP3 by adjusting a clamp voltage VCLAMP to voltage levels corresponding to respective stored current codes I_CODE0'<3:0> to I_CODE3'<3:0>, and adjust the current amounts of read currents IRD0 to IRD3 of the respective core blocks CORE0 to CORE3 to conform to the characteristics of the respective core blocks CORE0 to CORE3, by using the clamp voltages VCLAMP0 to VCLAMP3. Accordingly, the read margins of the respective core blocks CORE0 to CORE3 may be maximized. A test operation and a read current adjustment operation for each of the core blocks CORE0 to CORE3 are the same as described above with reference to FIG. 10.

One difference between the memory device of FIG. 17 and the memory device of FIG. 14 resides in that a plurality of core blocks share a code generation block such that it is possible to decrease differences in code values that are likely to be induced by the circuit characteristics of respective code generation blocks in the case of using a plurality of code generation blocks.

In the electronic devices according to the embodiments described above, a read margin may be increased by adjusting a read current or a reference current through reflecting the characteristic of each cell array.

The memory circuit or the semiconductor device as described above may be used in various devices or systems. Some of devices or systems which may be implemented with the memory circuit or the semiconductor device as described above are illustrated in FIGS. 18 to 22.

Figure 18:
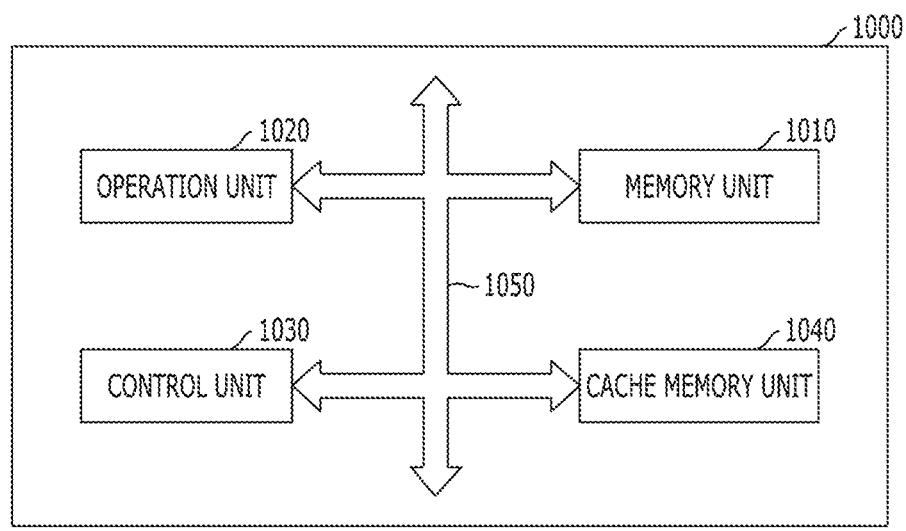
FIG. 18 is a configuration diagram illustrating an example of a microprocessor which is implemented with a memory device in accordance with an embodiment.

FIG. 18 is a configuration diagram illustrating an example of a microprocessor which is implemented with a memory device in accordance with an embodiment.

Referring to FIG. 18, a microprocessor 1000 may control and adjust a series of processes which receives data from various external devices, processes the data, and then sends a result to the external devices. The microprocessor 1000 may include a storage unit 1010, an operation unit 1020, a control unit 1030 and so on. The microprocessor 1000 may be various data processing devices such as a central processing unit (CPU), a graphic processing unit (GPU), a digital signal processor (DSP), an application processor (AP) and so on.

The storage unit 1010 may be a processor register, a register and so on, and be a part for storing the data in the microprocessor 1000. The storage unit 1010 may include a data register, an address register, a floating-point register, other various registers and so on. The storage unit 1010 may serve to temporarily store the data for performing an operation, the operation result data in the operation unit 1020, and an address in which the data is stored to be performed.

The storage unit 1010 may include one or more of the embodiments of the memory device as described above. For example, the storage unit 1010 may include a cell array including a plurality of resistive storage cells; a current code generation block suitable for generating a current code which has a value corresponding to an average value of current amounts of test currents respectively flowing through at least two first resistive storage cells among the plurality of resistive storage cells, in a test operation; and a sensing block suitable for comparing a read current flowing through a second resistive storage cell selected among the plurality of resistive storage cells with a reference current, and thereby sensing data of the second resistive storage cell, wherein the semiconductor memory is operable to adjust a current amount of at least one current flowing through the sensing block based on the value of the current code. Under such a design, a read margin of the storage unit 1010 may be increased. Consequently, a performance of the microprocessor 1000 may be improved.

The operation unit 1020 may perform a number of arithmetic and logical operations according to a result of decoding a command by the control unit 1030. The operation unit 1020 may include one or more arithmetic and logic units (ALU) and so on.

The control unit 1030 may receive a signal from the storage unit 1010, the operation unit 1020, an external device of the microprocessor 1000 and so on, and perform extraction or decode of the command, signal input/output control of the microprocessor 1000 and execute the processing which is represented by the program.

The microprocessor 1000 in accordance with the embodiment may further include a cache memory unit 1040 which may temporarily store data to be output to the external device or is input from the external device in addition to the storage unit 1010. The cache memory unit 1040 may exchange the data with the storage unit 1010, the operation unit 1020 and the control unit 1030 through a bus interface 1050.

Figure 19:
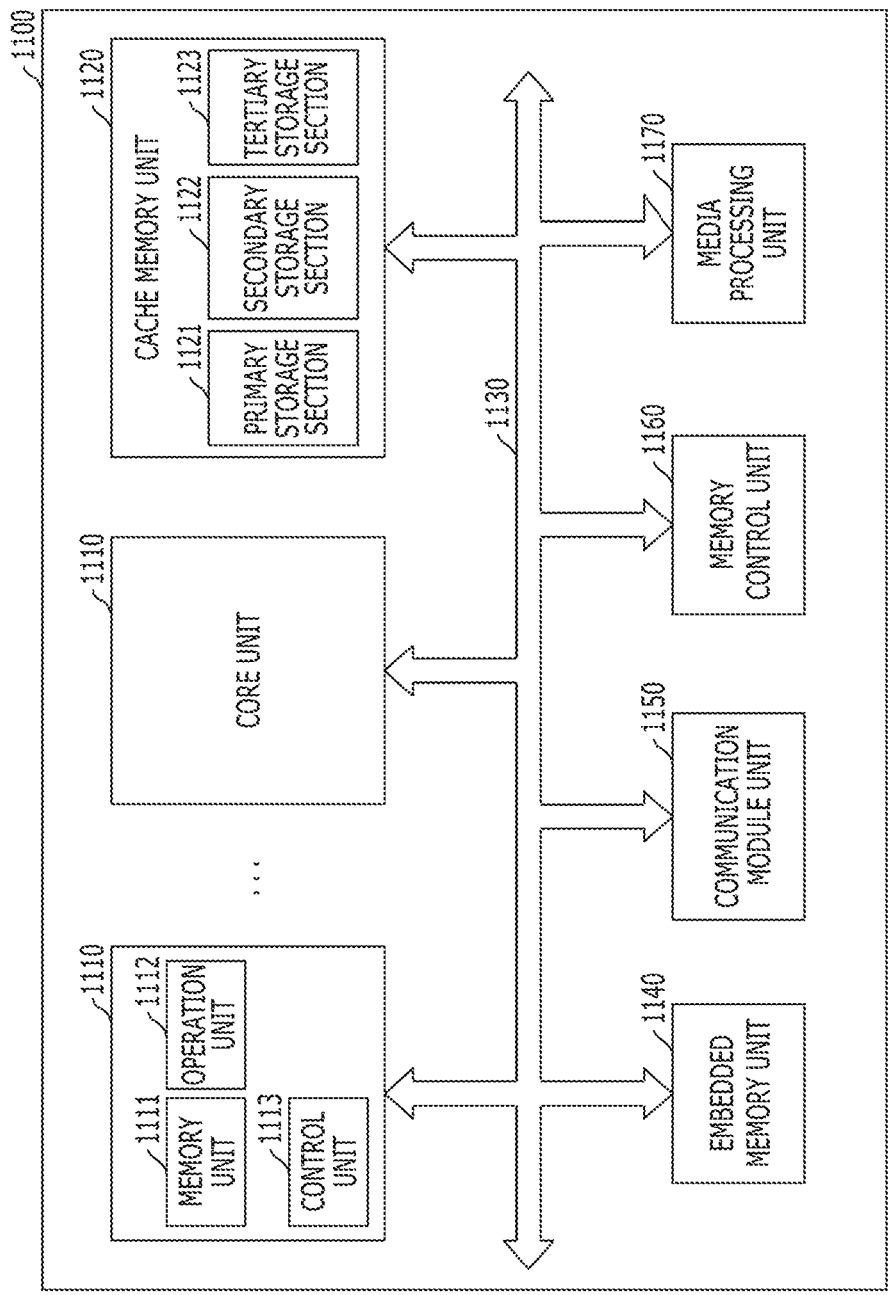
FIG. 19 is a configuration diagram illustrating an example of a processor which is implemented with a memory device in accordance with an embodiment.

FIG. 19 is a configuration diagram illustrating an example of a processor which is implemented with a memory device in accordance with an embodiment.

Referring to FIG. 19, a processor 1100 may improve performance and implement multi functions by including various functions in addition to a function of the microprocessor that control and adjust a series of processes which receives data from various external devices, processes the data, and then sends a result to the external devices. The processor 1100 may include a core unit 1110 serving as the microprocessor, a cache memory unit 1120 for temporarily storing data and a bus interface 1130 for transferring the data between an internal device and the external device. The processor 1100 may include a variety of system on chips (SoC) such as a multi core processor, a graphic processing unit (GPU), an application processor (AP) and so on.

The core unit 1110 may be a part for arithmetic and logic operating data input from the external device, and may include a storage unit 1111, an operation unit 1112 and a control unit 1113.

The storage unit 1111 may be a processor register, a register and so on, and be a part for storing the data in the processor 1100. The storage unit 1111 may include a data register, an address register, a floating-point register, other various registers and so on. The storage unit 1111 may serve to temporarily store the data for performing an operation, the operation result data in the operation unit 1112, and an address in which the data is stored to be performed. The operation unit 1112 is a part of performing the operation within the processor 1100, and may perform a number of arithmetic and logical operations according to a result of decoding a command by the control unit 1113. The operation unit 1112 may include one or more arithmetic and logic units (ALU) and so on. The control unit 1113 may receive a signal from the storage unit 1111, the operation unit 1112, the external device of the processor 1100 and so on, and perform extraction or decode of the command, signal input/output control of the processor 1111 and execute the processing which is represented by the program.

The cache memory unit 1120 is a part of temporarily storing data to compensate the data processing speed difference between the core unit 1110 which operates at high speed and the external device which operates at low speed. The cache memory unit 1120 may include a primary storage unit 1121, a secondary storage unit 1122, and a tertiary storage unit 1123. Generally, the cache memory unit 1120 may include the primary storage unit 1121 and the secondary storage unit 1122, and when high capacity is needed, the cache memory unit 1120 may include the third storage unit 1123. The cache memory unit 1120 may include more storage units as required. That is, the number of storage units which is included in the cache memory may depend on the design. The speeds for storing and determining data in the primary, the secondary and the tertiary storage units 1121, 1122 and 1123 may be the same as each other or be different from each other. When processing speeds of the storage units are different, a speed of the primary storage unit may be fastest. One or more storage units among the primary storage unit 1121, the secondary storage unit 1122 and the tertiary storage unit 1123 of the cache memory unit 1120 may include one or more of the embodiments of the memory devices as described above. For example, the cache memory unit 1120 may include a cell array including a plurality of resistive storage cells; a current code generation block suitable for generating a current code which has a value corresponding to an average value of current amounts of test currents respectively flowing through at least two first resistive storage cells among the plurality of resistive storage cells, in a test operation; and a sensing block suitable for comparing a read current flowing through a second resistive storage cell selected among the plurality of resistive storage cells with a reference current, and thereby sensing data of the second resistive storage cell, wherein the semiconductor memory is operable to adjust a current amount of at least one current flowing through the sensing block based on the value of the current code. Under such a design, a read margin of the cache memory unit 1120 may be increased. Consequently, a performance of the processor 1100 may be improved.

FIG. 19 is the configuration diagram illustrating all of the primary, the secondary and the tertiary storage units 1121, 1122 and 1123 are configured within the cache memory unit 1120. However, all of the primary, the secondary and the tertiary storage units 1121, 1122 and 1123 of the cache memory unit 1120 are configured in the outside of the core unit 1110, and the processing speed difference may be compensated between the core unit 1110 and the external device. Also, the primary storage unit 1121 of the cache memory unit 1120 may be configured within the core unit 1110, and the secondary and the tertiary storage units 1122 and 1123 may be configured in the outside of the core unit 1110, and the complementary function of the processing speed difference may be enhanced. Also, the primary and the secondary storage units 1121 and 1122 may be configured within the core unit 1110, and the tertiary storage unit 1123 may be configured in the outside of the core unit 1110.

The bus interface 1130 is a part which allows data to be efficiently transmitted by coupling the core unit 1110, the cache memory unit 1120 and the external device.

The processor 1100 may include a plurality of the core units 1110, and the plurality of the core units 1110 may share the cache memory unit 1120. The plurality of the core units 1110 and the cache memory unit 1120 may be coupled directly, or may be coupled through the bus interface 1130. All of the plurality of the core units 1110 may have the same configuration as the core unit as described above. When the processor 1100 includes the plurality of the core units 1110, the primary storage unit 1121 of the cache memory unit 1120 may correspond to the number of a plurality of the core units 1110 and the primary storage unit 1121 may be configured in each of the core unit 1110, and the secondary and the tertiary storage units 1122 and 1123 may be configured in the outsides of the plurality of the core units 1110 to be shared through the bus interface 1130. Herein, the processing speed of the primary storage unit 1121 may be faster than the processing speeds of the secondary and the tertiary storage units 1122 and 1123. In the other embodiment, the primary storage unit 1121 and the secondary storage units 1122 may correspond to the number of the plurality of the core units 1110, and may be configured in each of the core unit 1110, the tertiary storage unit 1123 may be configured to be shared through the interface in the outsides of the plurality of the core units 1110.

The processor 1100 may further include an embedded memory unit 1140 for storing data, a communication module unit 1150 for sending and receiving the data with the external device in a wired or wireless manner, a memory control unit 1160 for driving an external storage device, a media processing unit 1170 for processing data processed in the processor 1100 or data input from an external input device and outputting the processed data to the external interface device and so on, and may further include a plurality of modules and devices. The plurality of the modules which are added may exchange the data with the core unit 1110 and the cache memory unit 1120 through the bus interface 1130.

The embedded memory unit 1140 may include a nonvolatile memory as well as a volatile memory. The volatile memory may include a dynamic random access memory (DRAM), a mobile DRAM, a static random access memory (SRAM) and a memory for performing a function similar thereto, and the non-volatile memory may include a read only memory (ROM), a NOR flash memory, a NAND flash memory, a phase change random access memory (PRAM), a resistive random access memory (RRAM), a spin transfer torque random access memory (STTRAM), a magnetic random access memory (MRAM) and the memory for performing the function similar thereto.

The communication module unit 1150 may include a module which may be coupled to a wired network, a module which may be coupled to a wireless network and all of these modules. The module which may be coupled to the wired network may include a local area network (LAN), a universal serial bus (USB), an Ethernet, a power line communication (PLC) and so on as like various devices for sending and receiving the data through a transmission line. The module which may be coupled to the wireless network may include an infrared data association (IrDA), a code division multiple access (CDMA), a time division multiple access (TDMA), a frequency division multiple access (FDMA), a wireless LAN, a zigbee, an ubiquitous sensor network (USN), a bluetooth, a radio frequency identification (RFID), a long term evolution (LTE), a near field communication (NFC), a wireless broadband internet (Wibro), a high speed downlink packet access (HSDPA), a wideband CDMA (WCDMA), an ultra wideband (UWB) and so on as like various devices for sending and receiving the data without a transmission line.

The memory control unit 1160 may process and manage the data which is transmitted between the processor 1100 and the external storage device which operates according to a different communication standard from the processor 1100, and include various controllers for controlling memory controllers such as an integrated device electronics (IDE), a serial advanced technology attachment (SATA), a small computer system interface (SCSI), a redundant array of independent disks (RAID), a solid state disk (SSD), an external SATA (eSATA), a personal computer memory card international association (PCMCIA), an universal serial bus (USB), a secure digital card (SD), a mini secure digital card (mSD), a micro SD, a secure digital high capacity (SDHC), a memory stick card, a smart media card (SM), a multi media card (MMC), an embedded MMC (eMMC), a compact flash (CF) and so on.

The media processing unit 1170 may process the data which is processed in the processor 1100 or which is input in a video, an audio, and other forms from the external input device, and output the data to the external interface device. The media processing unit 1170 may include a graphics processing unit (GPU), a digital signal processor (DSP), a high definition audio (HD Audio), a high definition multimedia interface (HDMI) controller and so on.

Figure 20:
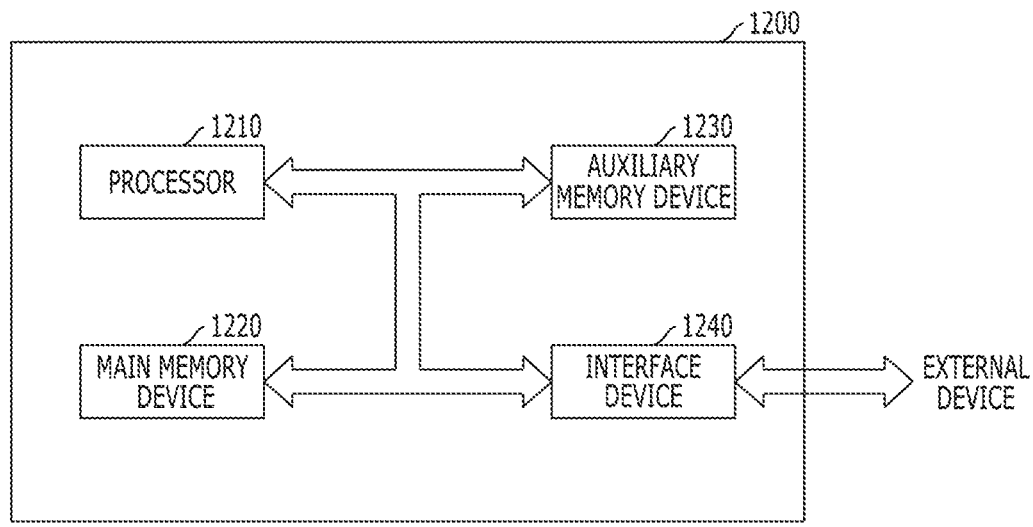
FIG. 20 is a configuration diagram illustrating an example of a system which is implemented with a memory device in accordance with an embodiment.

FIG. 20 is a configuration diagram illustrating an example of a system which is implemented with a memory device in accordance with an embodiment.

Referring to FIG. 20, a system 1200 is a device for processing data, and may perform input, processing, output, communication, storage and so on the data for performing a series of operations. The system 1200 may include a processor 1210, a main memory device 1220, an auxiliary memory device 1230, an interface device 1240 and so on. The system 1200 may be various electronic systems which operate using a process such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, a telematics, an audio visual system, a smart television and so on.

The processor 1210 may control processing such as interpretation of an input command, operation and comparison of the data stored in the system 1200 and so on. The processor 1210 may include a micro processor unit (MPU), a central processing unit (CPU), a single/multi core processor, a graphic processing unit (GPU), an application processor (AP), a digital signal processor (DSP) and so on.

The main memory device 1220 may be a memory device which imports a program code or data from the auxiliary memory device 1230, and stores and execute the program code or the data when the program is performed. Contents which are stored in the main memory device 1220 may be retained when power is interrupted. The main memory device 1220 may include one or more of the embodiments of the memory devices as described above. For example, the main memory device 1220 may include a cell array including a plurality of resistive storage cells; a current code generation block suitable for generating a current code which has a value corresponding to an average value of current amounts of test currents respectively flowing through at least two first resistive storage cells among the plurality of resistive storage cells, in a test operation; and a sensing block suitable for comparing a read current flowing through a second resistive storage cell selected among the plurality of resistive storage cells with a reference current, and thereby sensing data of the second resistive storage cell, wherein the semiconductor memory is operable to adjust a current amount of at least one current flowing through the sensing block based on the value of the current code. Under such a design, a read margin of the main memory device 1220 may be increased. Consequently, a performance of the system 1200 may be improved.

The main memory device 1220 may further include a volatile memory which contents are entirely erased when the power is interrupted, such as a static random access memory (SRAM), a dynamic random access memory (DRAM) and so on. On the other hand, the main memory device 1220 may not include the embodiments of the memory devices as described above, and may include the volatile memory which contents are entirely erased when the power is interrupted, such as the static random access memory (SRAM), the dynamic random access memory (DRAM) and so on.

The auxiliary memory device 1230 may be a memory device for storing data and a program code. A speed of the auxiliary memory device 1230 is slower than the speed of the main memory device 1220, but the auxiliary memory device 1230 may store a lot of data. The auxiliary memory device 1230 may include one or more of the embodiments of the memory devices as described above. For example, the auxiliary memory device 1230 may include a cell array including a plurality of resistive storage cells; a current code generation block suitable for generating a current code which has a value corresponding to an average value of current amounts of test currents respectively flowing through at least two first resistive storage cells among the plurality of resistive storage cells, in a test operation; and a sensing block suitable for comparing a read current flowing through a second resistive storage cell selected among the plurality of resistive storage cells with a reference current, and thereby sensing data of the second resistive storage cell, wherein the semiconductor memory is operable to adjust a current amount of at least one current flowing through the sensing block based on the value of the current code. Under such a design, a read margin of the auxiliary memory device 1230 may be increased. Consequently, a performance of the system 1200 may be improved.

The auxiliary memory device 1230 may further include a data storage system such as a magnetic tape and a magnetic disk using magnetism, a laser disk using light, a magnetic-optical disk using the light and the magnetism, a solid state disk (SSD), an universal serial bus memory (USBM), a secure digital (SD), a mini secure digital card (mSD), a micro SD, a secure digital high capacity (SDHC), a memory stick card, a smart media card (SM), a multi media card (MMC), an embedded MMC (eMMC), a compact flash (CF) and so on. On the other hand, the auxiliary memory device 1230 may not include the embodiments of the memory devices as described above, and may include the data storage system such as the magnetic tape and the magnetic disk using magnetism, the laser disk using light, the magnetic-optical disk using the light and the magnetism, the solid state disk (SSD), the universal serial bus memory (USBM), the secure digital (SD), the mini secure digital card (mSD), the micro (SD), the secure digital high capacity (SDHC), the memory stick card, the smart media card (SM), the multi media card (MMC), the embedded MMC (eMMC), the compact flash (CF) and so on.

The interface device 1240 may exchange a command, data and so on between the system 1200 and the external device, and be a keypad, a keyboard, a mouse, a speaker, a mike, a display, a human interface device (HID), a communication device and so on. The communication device may include a module which may be coupled to a wired network, a module which may be coupled to a wireless network and all of these modules. The module which may be coupled to the wired network may include a local area network (LAN), a universal serial bus (USB), an Ethernet, a power line communication (PLC) and so on as like various devices for sending and receiving the data through a transmission line. The module which may be coupled to the wireless network may include an infrared data association (IrDA), a code division multiple access (CDMA), a time division multiple access (TDMA), a frequency division multiple access (FDMA), a wireless LAN, a zigbee, an ubiquitous sensor network (USN), a bluetooth, a radio frequency identification (RFID), a long term evolution (LTE), a near field communication (NFC), a wireless broadband internet (Wibro), a high speed downlink packet access (HSDPA), a wideband CDMA (WCDMA), an ultra wideband (UWB) as like various devices for sending and receiving the data without a transmission line.

Figure 21:
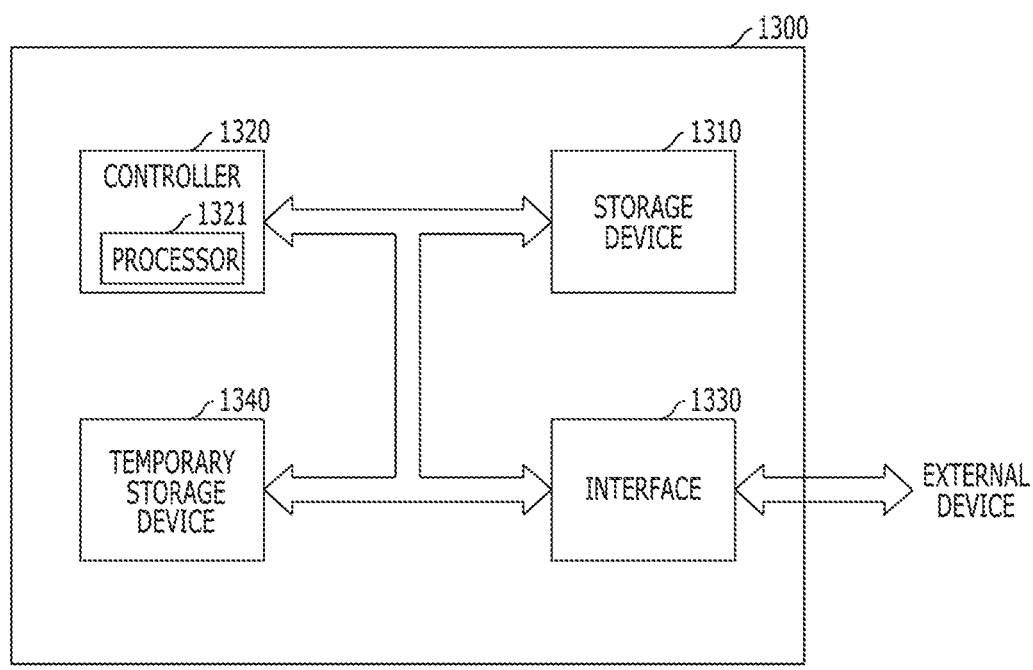
FIG. 21 is a configuration diagram illustrating an example of a data storage system which is implemented with a memory device in accordance with an embodiment.

FIG. 21 is a configuration diagram illustrating an example of a data storage system which is implemented with a memory device in accordance with an embodiment.

Referring to FIG. 21, a data storage system 1300 may include a storage device 1310 for storing data and having a non-volatile characteristic, a controller 1320 for controlling the storage device, an interface 1330 for coupling to an external device and a temporary storage device 1340 for temporarily storing data. The data storage system 1300 may be a disk type such as a hard disk drive (HDD), a compact disc read only memory (CDROM), a digital versatile disc (DVD), a solid state disk (SSD) and so on, and be a card type such as an universal serial bus memory (USBM), a secure digital (SD), a mini secure digital card (mSD), a micro SD, a secure digital high capacity (SDHC), a memory stick card, a smart media card (SM), a multi media card (MMC), an embedded MMC (eMMC), a compact flash (CF) and so on.

The storage device 1310 may include a non-volatile memory which semi-permanently stores data. The non-volatile memory may include a read only memory (ROM), a NOR flash memory, a NAND flash memory, a phase change random access memory (PRAM), a resistive random access memory (RRAM), magnetic random access memory (MRAM) and so on.

The controller 1320 may control exchange of data between the storage device 1310 and the interface 1330. The controller 1320 may include a processor 1321 which performs an operation and so on for processing commands which are input through the interface 1330 from the outside of the data storage system 1300.

The interface 1330 may exchange a command, data and so on between the data storage system 1300 and the external device. When the data storage system 1300 may be the card type, the interface 1330 may be compatible with interfaces which are used in a device such as the universal serial bus memory (USBM), the secure digital (SD), the mini secure digital card (mSD), the micro SD, the secure digital high capacity (SDHC), the memory stick card, the smart media card (SM), the multi media card (MMC), the embedded MMC (eMMC), the compact flash (CF) and so on, or be compatible with interfaces which are used in the device similar thereto. When the data storage system 1300 may be the disk type, the interface 1330 may be compatible with the interfaces such as an integrated device electronics (IDE), a serial advanced technology attachment (SATA), a small computer system interface (SCSI), an external SATA (eSATA), a personal computer memory card international association (PCMCIA), an universal serial bus (USB) and so on, or be compatible with interfaces which are used in the device similar thereto. The interface 1330 may be compatible with one or more interfaces which have different types.

The temporary storage device 1340 may temporarily store data to efficiently transfer the data between the interface 1330 and the storage device 1310 according to diversification and high performance of an interface with the external device, the controller, the system. The temporary storage device 1340 may include one or more of the embodiments of the memory devices as described above. For example, the temporary storage device 1340 may include a cell array including a plurality of resistive storage cells; a current code generation block suitable for generating a current code which has a value corresponding to an average value of current amounts of test currents respectively flowing through at least two first resistive storage cells among the plurality of resistive storage cells, in a test operation; and a sensing block suitable for comparing a read current flowing through a second resistive storage cell selected among the plurality of resistive storage cells with a reference current, and thereby sensing data of the second resistive storage cell, wherein the semiconductor memory is operable to adjust a current amount of at least one current flowing through the sensing block based on the value of the current code. Under such a design, a read margin of the temporary storage device 1340 may be increased. Consequently, a performance of the data storage system 1300 may be improved.

Figure 22:
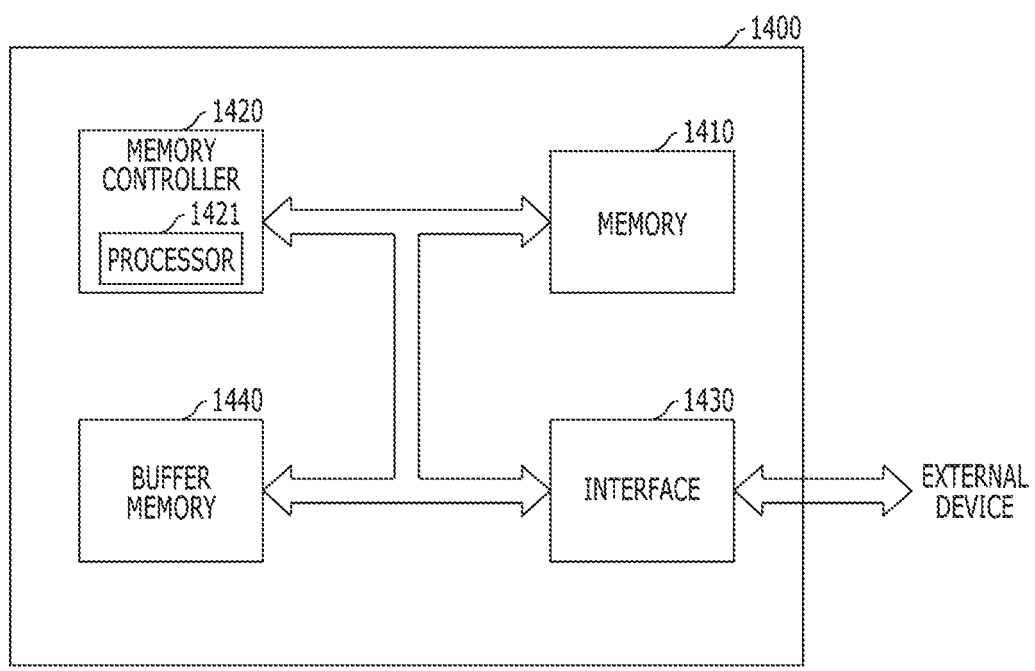
FIG. 22 is a configuration diagram illustrating an example of a memory system which is implemented with a memory device in accordance with an embodiment.

FIG. 22 is a configuration diagram illustrating an example of a memory system which is implemented with a memory device in accordance with an embodiment.

Referring to FIG. 22, a memory system 1400 may include a memory 1410 for storing data and having a non-volatile characteristic, a memory controller 1420 for controlling the memory, and an interface 1430 for coupling to an external device. The memory system 1400 may be a card type such as a solid state disk (SSD), an universal serial bus memory (USBM), a secure digital (SD), a mini secure digital card (mSD), a micro SD, a secure digital high capacity (SDHC), a memory stick card, a smart media card (SM), a multi media card (MMC), an embedded MMC (eMMC), a compact flash (CF) and so on.

The memory 1410 may include one or more of the embodiments of the memory devices as described above. For example, the memory 1410 may include a cell array including a plurality of resistive storage cells; a current code generation block suitable for generating a current code which has a value corresponding to an average value of current amounts of test currents respectively flowing through at least two first resistive storage cells among the plurality of resistive storage cells, in a test operation; and a sensing block suitable for comparing a read current flowing through a second resistive storage cell selected among the plurality of resistive storage cells with a reference current, and thereby sensing data of the second resistive storage cell, wherein the semiconductor memory is operable to adjust a current amount of at least one current flowing through the sensing block based on the value of the current code. Under such a design, a read margin of the memory 1410 may be increased. Consequently, a performance of the memory system 1400 may be improved.

The memory may include a read only memory (ROM), a NOR flash memory, a NAND flash memory, a phase change random access memory (PRAM), a resistive random access memory (RRAM), a magnetic random access memory (MRAM) and so on having a non-volatile characteristic.

The memory controller 1420 may control exchange of data between the memory 1410 and the interface 1430. The memory controller 1420 may include a processor 1421 which performs an operation and so on for processing commands which are input through the interface 1430 from the outside of the memory system 1400.

The interface 1430 may exchange a command, data and so on between the memory system 1400 and the external device. The interface 1430 may be compatible with interfaces which are used in a device such as such as the universal serial bus memory (USBM), the secure digital (SD), the mini secure digital card (mSD), the micro SD, the secure digital high capacity (SDHC), the memory stick card, the smart media card (SM), the multi media card (MMC), the embedded MMC (eMMC), the compact flash (CF) and so on, or be compatible with interfaces which are used in the device similar thereto. The interface 1430 may be compatible with one or more interfaces which have different types.

The memory system 1400 may further include a buffer memory 1440 to efficiently transfer an input and an output of the data between the interface 1430 and the memory 1410 according to diversification and high performance of an interface with the external device, the memory controller, the memory system. The buffer memory 1440 which temporarily stores data may include one or more of the embodiments of the memory devices as described above. For example, The buffer memory 1440 may include a cell array including a plurality of resistive storage cells; a current code generation block suitable for generating a current code which has a value corresponding to an average value of current amounts of test currents respectively flowing through at least two first resistive storage cells among the plurality of resistive storage cells, in a test operation; and a sensing block suitable for comparing a read current flowing through a second resistive storage cell selected among the plurality of resistive storage cells with a reference current, and thereby sensing data of the second resistive storage cell, wherein the semiconductor memory is operable to adjust a current amount of at least one current flowing through the sensing block based on the value of the current code. Under such a design, a read margin of the buffer memory 1440 may be increased. Consequently, a performance of the memory system 1400 may be improved.

The buffer memory 1440 may include a static random access memory (SRAM) and a dynamic random access memory (DRAM) having a volatile characteristic, and include a read only memory (ROM), a NOR Flash Memory, a NAND Flash Memory, a phase change random access memory (PRAM), a resistive random access memory (RRAM), a spin transfer torque random access memory (STTRAM), a magnetic random access memory (MRAM) and so on having a non-volatile characteristic. On the other hand, the buffer memory 1440 may not include the embodiment of the memory devices as described above, and may include the static random access memory (SRAM), the dynamic random access memory (DRAM) having the volatile characteristic, and include the read only memory (ROM), the NOR Flash Memory, the NAND Flash Memory, the phase change random access memory (PRAM), the resistive random access memory (RRAM), the spin transfer torque random access memory (STTRAM), the magnetic random access memory (MRAM) and so on having the non-volatile characteristic.

The characteristic of the electronic device or system in FIGS. 8 to 12 may be implemented with various devices, a system, or an application. For example, a mobile phone or other portable communication device, a tablet computer, a notebook or laptop computer, a game machine, a smart TV set, a TV set-top box, a multi media server, a digital camera having a wired and wireless communication function, a wristwatch or other wearing device having a wireless communication function.

Various embodiments have been described for illustrative purposes, it will be apparent to those skilled in the art that various changes and modifications may be made.

What is claimed is:

1. An electronic device including a semiconductor memory, the semiconductor memory comprising:
   a cell array including a plurality of resistive storage cells;
   a current code generation block suitable for generating a current code which has a value corresponding to an average value of current amounts of test currents respectively flowing through at least two first resistive storage cells among the plurality of resistive storage cells, in a test operation; and
   a sensing block suitable for comparing a read current flowing through a second resistive storage cell selected among the plurality of resistive storage cells with a reference current, and thereby sensing data of the second resistive storage cell,
   wherein the semiconductor memory is operable to adjust the read current flowing through the second resistive storage cell based on the value of the current code,
   wherein the semiconductor memory is operable to decrease the read current flowing through the second resistive storage cell when the average value of current amounts of test currents is greater than a predetermined value, and to increase the read current flowing through the second resistive storage cell when the average value of current amounts of test currents is smaller than the predetermined value,
   wherein the code generation unit comprises:
   an integrator that integrates the average current according to a time and generating an output voltage; and
   a plurality of comparing sections that compare the output voltage with a plurality of comparison voltages which have different levels, after a predetermined time passes from a time at which integration of the integrator is started, and generate corresponding bits among a plurality of bits included in the current code.

2. The electronic device according to claim 1, wherein the semiconductor memory further comprises:
   a nonvolatile storage block for storing the current code and coupled to the current code generation block.

3. The electronic device according to claim 1, wherein the current code generation block comprises:
   an average current generation unit that generates the average current which has a current amount corresponding to the average value of the current amounts of the test currents; in the test operation; and
   a code generation unit that generates the current code based on the average current.

4. The electronic device according to claim 3, wherein the average current generation unit comprises at least two current copy sections that generate copy currents by copying the test current flowing through a first resistive storage cell selected among a group of first resistive storage cells in the case, and generates the average current by summing the copy currents copied by the at least two current copy sections.

5. An electronic device including a semiconductor memory, the semiconductor memory comprising:
   a cell array including a plurality of resistive storage cells;
   a current code generation block suitable for generating a current code which has a value corresponding to an average value of current amounts of test currents respectively flowing through at least two first resistive storage cells among the plurality of resistive storage cells, in a test operation; and
   a sensing block suitable for comparing a read current flowing through a second resistive storage cell selected among the plurality of resistive storage cells with a reference current, and thereby sensing data of the second resistive storage cell, and
   wherein the semiconductor memory is operable to adjust a current amount of at least one current flowing through the sensing block based on the value of the current code,
   wherein the current code generation block comprises an average current generation unit that generates the average current which has a current amount corresponding to the average value of the current amounts of the test currents, in the test operation; and a code generation unit that generates the current code based on the average current, and
   wherein the code generation unit comprises:
   an integrator that integrates the average current according to a time and generating an output voltage; and
   a plurality of comparing sections that compare the output voltage with a plurality of comparison voltages which have different levels, after a predetermined time passes from a time at which integration of the integrator is started, and generate corresponding bits among a plurality of bits included in the current code.

6. The electronic device according to claim 1, wherein, the semiconductor memory is structured such that, in the test operation, the plurality of resistive storage cells are written with the same data.

7. The electronic device according to claim 1,
   wherein the semiconductor memory is operable to adjust a current amount of the reference current based on the value of the current code, and
   wherein the semiconductor memory is operable to increase the current amount of the reference current when the average value of the current amounts of the test currents is increased, and to decrease the current amount of the reference current when the average value of the current amounts of the test currents is decreased.

8. The electronic device according to claim 1, wherein each of the resistive storage cells comprises:
a variable resistance element structured to exhibit variable resistance values and being set at a particular resistance value representing data stored in the resistive storage cell; and
a selection element coupled to the variable resistance element to turn on or off a conductive path to the variable resistance element.

9. The electronic device according to claim 8, wherein the variable resistance element comprises a metal oxide or a structure in which a tunneling barrier layer is interposed between two ferromagnetic layers.

10. The electronic device of claim 1, further comprising a microprocessor,
wherein the microprocessor comprising:
an access control unit suitable for receiving a signal having a command from an outside of the microprocessor, extracting or decoding the command, or performing input/output control of the signal of the microprocessor;
an operation unit suitable for performing an operation according to a decoding result of the command in the access control unit; and
a storage unit suitable for storing data to be operated, data corresponding to an operation result, or an address of the data to be operated, and
wherein the semiconductor memory is a part of the storage unit within the microprocessor.

11. The electronic device of claim 1, further comprising a processor,
wherein the processor comprising:
a core unit suitable for performing an operation corresponding to a command using data according to the command input from an outside of the processor; a cache memory unit suitable for storing data to be operated, data corresponding to an operation result, or an address of the data to be operated; and
a bus interface which is coupled between the core unit and the cache memory unit, and transfers data between the core unit and the cache memory unit, and
wherein the semiconductor memory is a part of the cache memory unit within the processor.

12. The electronic device of claim 1, further comprising a processing system, and
wherein the processing system comprising:
a processor suitable for interpreting a received command, and controlling an operation of information according to an interpreting result of the command;
an auxiliary memory device suitable for storing a program for interpreting the command and the information;
a main memory device suitable for importing and storing the program and the information from the auxiliary memory device such that the processor performs the operation using the program and the information when the program is executed; and
an interface device suitable for performing communication between one or more of the processor, the auxiliary memory device and the main memory device and an outside, and
wherein the semiconductor memory is a part of the auxiliary memory device or the main memory device within the processing system.

13. The electronic device of claim 1, further comprising a data storage system,
wherein the data storage system comprising:
a storage device suitable for storing data and retaining the stored data regardless of a power supply;
a controller suitable for controlling data input/output of the storage device according to a command input from an outside;
a temporary storage device suitable for temporarily storing the data which is exchanged between the storage device and the outside; and
an interface suitable for performing communication between one or more of the storage device, the controller and the temporary storage device and the outside, and
wherein the semiconductor memory is a part of the storage device or the temporary storage device within the data storage system.

14. The electronic device of claim 1, further comprising a memory system,
wherein the memory system comprising:
a memory suitable for storing data and retaining the stored data regardless of a power supply;
a memory controller suitable for controlling data input/output of the memory according to a command input from an outside;
a buffer memory suitable for buffering the data which is exchanged between the memory and the outside; and
an interface suitable for performing communication between one or more of the memory, the memory controller and the buffer memory and the outside, and
wherein, the semiconductor memory is a part of the memory or the buffer memory within the memory system.

15. The electronic device of claim 1, wherein one of the plurality of resistive storage cells includes two ferromagnetic layers and a tunneling barrier layer interposed between the two ferromagnetic layers.

16. The electronic device of claim 15, wherein one of the plurality of resistive storage cells has a variable resistance that is determined based on magnetization directions of the two ferromagnetic layers.

17. The electronic device of claim 1, further comprising a voltage generation block structured to generate a clamp voltage to adjust the read current and a first reference voltage to adjust the reference current.

18. The electronic device of claim 17, further comprising a voltage adjustment block located to receive the first reference voltage from the voltage generation block and structured to generate a second reference voltage based on the current code.

19. The electronic device of claim 18, wherein the reference current increases as the second reference voltage increases and decreases as the second reference voltage decreases.

* * * * *